United States Patent
Wang et al.

(10) Patent No.: US 11,121,726 B2
(45) Date of Patent: Sep. 14, 2021

(54) ENCODING AND DECODING METHODS, APPARATUSES, AND DEVICES

(71) Applicant: HUAWEI TECHNOLOGIES CO., LTD., Shenzhen (CN)

(72) Inventors: Xinyuan Wang, Beijing (CN); Wenbin Yang, Beijing (CN); Zhongfeng Wang, Nanjing (CN); Jun Lin, Nanjing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/993,266

(22) Filed: Aug. 14, 2020

(65) Prior Publication Data

US 2020/0373942 A1 Nov. 26, 2020

Related U.S. Application Data

(63) Continuation of application No. PCT/CN2018/076906, filed on Feb. 14, 2018.

(51) Int. Cl.
| | |
|---|---|
| *H03M 13/00* | (2006.01) |
| *H03M 13/29* | (2006.01) |
| *H03M 13/15* | (2006.01) |
| *H04L 27/04* | (2006.01) |
| *H04L 27/06* | (2006.01) |

(52) U.S. Cl.
CPC ..... *H03M 13/2909* (2013.01); *H03M 13/152* (2013.01); *H03M 13/616* (2013.01); *H04L 27/04* (2013.01); *H04L 27/06* (2013.01)

(58) Field of Classification Search
CPC ......... H03M 13/29029; H03M 13/152; H03M 13/616; H04L 27/04; H04L 27/06
See application file for complete search history.

(56) References Cited

U.S. PATENT DOCUMENTS

| | | | | |
|---|---|---|---|---|
| 9,674,025 | B2 * | 6/2017 | Dickson | .................. H04L 27/01 |
| 2008/0109703 | A1 | 5/2008 | Brandman | |
| 2012/0250785 | A1 | 10/2012 | Vidal et al. | |
| 2014/0169789 | A1 * | 6/2014 | Bhoja | .................. H04B 10/272 |
| | | | | 398/45 |

(Continued)

FOREIGN PATENT DOCUMENTS

| | | |
|---|---|---|
| CN | 101043483 A | 9/2007 |
| CN | 101989887 A | 3/2011 |

(Continued)

*Primary Examiner* — Samir W Rizk
(74) *Attorney, Agent, or Firm* — Maier & Maier, PLLC

(57) ABSTRACT

This application provides an encoding method, comprising: encoding first data to generate a first encoded sequence; encoding second data to generate a second encoded sequence, where a quantity of bits comprised in the first data is greater than a quantity of bits comprised in the second data, and a quantity of bits comprised in the first encoded sequence is equal to a quantity of bits comprised in the second encoded sequence; generating a symbol sequence by performing a PAM-4 modulation on an input signal, the first encoded sequence corresponds to a high bit of the input signal, and the second encoded sequence corresponds to a low bit of the input signal; and sending the symbol sequence. The method helps reduce a quantity of redundant bits, helps improve a code rate, and can reduce redundant information carried in a modulated symbol sequence.

18 Claims, 6 Drawing Sheets

(56) References Cited

U.S. PATENT DOCUMENTS

2014/0201604 A1 7/2014 Wang
2016/0204873 A1 7/2016 Perez De Aranda Alonso et al.
2018/0205493 A1 7/2018 Yang et al.

FOREIGN PATENT DOCUMENTS

| CN | 102684830 A | 9/2012 |
| CN | 103795493 A | 5/2014 |
| CN | 105122688 A | 12/2015 |
| CN | 105122693 A | 12/2015 |
| CN | 105790888 A | 7/2016 |
| EP | 3324583 A1 | 5/2018 |
| JP | 2004023691 A | 1/2004 |
| WO | 2006066445 A1 | 6/2006 |
| WO | 2014138497 A1 | 9/2014 |
| WO | 2017193309 A1 | 11/2017 |

* cited by examiner

ENCODING AND DECODING METHODS, APPARATUSES, AND DEVICES

CROSS-REFERENCE TO RELATED APPLICATIONS

This application is a continuation of International Application No. PCT/CN2018/076906, filed on Feb. 14, 2018, the disclosure of which is hereby incorporated by reference in its entirety.

TECHNICAL FIELD

This application relates to the field of mobile communications, and more specifically, to encoding and decoding methods, encoding and decoding apparatuses, and encoding and decoding devices in the field of mobile communications.

BACKGROUND

Usually, during transmission of data in a digital communications system, a channel for transmitting the data interferes with the data transmitted on the channel. Consequently, a data receiver may fail to receive correct raw data.

A forward error correction (FEC) technology may be used to correct an error caused in a data transmission process. Based on the FEC technology, a data sender encodes to-be-transmitted data information, and introduces particular redundant data during encoding, so that the data receiver can use the redundant data to detect and correct an error caused in the transmission process.

For example, a Reed-Solomon (RS) code may be used to encode data that includes 514 bits. 30 check bits (or referred to as redundant bits) are added through encoding. A quantity of bits comprised in a generated encoded sequence is 544. An error correction capability of the encoded sequence is 15.

In the prior art, a relatively large quantity of redundant bits need to be comprised in an encoded sequence. If the encoded sequence is modulated to generate a symbol sequence, the symbol sequence also carries relatively much redundant information.

SUMMARY

This application provides an encoding method, which helps reduce a quantity of redundant bits comprised in an encoded sequence, and helps improve a code rate. When a symbol sequence is generated by modulating the encoded sequence, the encoding method helps reduce redundant information carried in the symbol sequence.

According to a first aspect, an encoding method is provided, and the method is performed by an encoding device, and includes: encoding first data in a first encoding manner to generate a first encoded sequence; encoding second data in a second encoding manner to generate a second encoded sequence, where a quantity of bits comprised in the first data is greater than a quantity of bits comprised in the second data, and a quantity of bits comprised in the first encoded sequence is equal to a quantity of bits comprised in the second encoded sequence; performing Four-level Pulse Amplitude Modulation (Four-level Pulse Amplitude Modulation, PAM-4) modulation on an input signal to generate a symbol sequence, where the input signal includes the first encoded sequence and the second encoded sequence, the first encoded sequence corresponds to a high bit of the input signal, and the second encoded sequence corresponds to a low bit of the input signal; and sending the symbol sequence.

It should be noted that, a code rate and an error correction capability corresponding to the first encoding manner are different from a code rate and an error correction capability corresponding to the second encoding manner.

In a PAM-4 modulation manner, after a low bit signal in an input symbol sequence is modulated, an amplitude of a modulated signal corresponding to the low bit signal is relatively small, and after a high bit signal in the input symbol sequence is modulated, an amplitude of a modulated signal corresponding to the high bit signal is relatively large. Therefore, during a transmission process of the symbol sequence, an anti-interference capability of the high bit signal is stronger than that of the low bit signal. Therefore, when to-be-encoded data corresponding to the high bit signal is encoded, a relatively small quantity of redundant bits may be added.

In this embodiment of this application, the to-be-encoded data is divided into two parts (for example, the first data and the second data), so that the quantity of the bits comprised in the first data is greater than the quantity of the bits comprised in the second data, and the quantity of the bits comprised in the first encoded sequence (corresponding to a high bit of a modulated symbol sequence) that is obtained by encoding the first data in the first encoding manner is equal to the quantity of the bits comprised in the second encoded sequence (corresponding to a low bit of the modulated symbol sequence) that is obtained by encoding the second data in the second encoding manner.

Therefore, a quantity of redundant bits added when the first data is encoded in the first encoding manner is less than a quantity of redundant bits added when the second data is encoded in the second encoding manner. Compared with that an encoding manner (for example, the second encoding manner) with a relatively high error correction capability is used for encoding both the first data and the second data, the solutions of this application help reduce a quantity of redundant bits, help improve a code rate, and can reduce redundant information carried in the modulated symbol sequence.

Optionally, the first data includes 6448 bits, and the second data includes 5668 bits.

Optionally, both the 6448 bits comprised in the first data and the 5668 bits comprised in the second data may be consecutive bits in the to-be-encoded data, or may be inconsecutive bits in the to-be-encoded data.

Optionally, the quantity of the bits comprised in the first encoded sequence is 6500, and the quantity of the bits comprised in the second encoded sequence is 6500.

Optionally, the first encoding manner is a Bose-Chaudhuri-Hocquenghem (BCH) encoding manner, and the second encoding manner is the BCH encoding manner.

The first data includes 6448 bits, the second data includes 5668 bits, and both the quantity of the bits comprised in the first encoded sequence and the quantity of the bits comprised in the second encoded sequence that are generated by respectively encoding the first data and the second data in the BCH encoding manner are 6500. The first encoded sequence is used as a high bit during PAM-4 modulation and the second encoded sequence is used as a low bit during PAM-4 modulation, so that when a redundancy rate is 7%, and a bit error rate (BER) is $10^{-15}$, an encoding gain reaches 8.6 decibels (dBs).

Optionally, the first data includes 5324 bits, and the second data includes 4700 bits.

Optionally, both the 5324 bits comprised in the first data and the 4700 bits comprised in the second data may be consecutive bits in the to-be-encoded data, or may be inconsecutive bits in the to-be-encoded data.

Optionally, the quantity of the bits comprised in the first encoded sequence is 5376, and the quantity of the bits comprised in the second encoded sequence is 5376.

Optionally, the first encoding manner is the BCH encoding manner, and the second encoding manner is the BCH encoding manner.

The first data includes 5324 bits, the second data includes 4700 bits, and both the quantity of the bits comprised in the first encoded sequence and the quantity of the bits comprised in the second encoded sequence that are generated by respectively encoding the first data and the second data in the BCH encoding manner are 5376. The first encoded sequence is used as a high bit during PAM-4 modulation and the second encoded sequence is used as a low bit during PAM-4 modulation, so that when a redundancy rate is 7%, and a BER is $10^{-15}$, an encoding gain reaches 8.45 dB.

Optionally, the first encoding manner is the BCH encoding manner, the second encoded sequence is obtained by encoding a to-be-encoded matrix in a product code encoding manner, where the to-be-encoded matrix is an (n+m)×(n+m) matrix, n≥2, m≥1, both m and n are integers, elements in columns 1 to n of each row in rows 1 to n in the to-be-encoded matrix are bits in the second data, elements in columns n+1 to n+m of row i in the to-be-encoded matrix are m bits comprised in check values that are generated based on bits in row i in the to-be-encoded matrix, elements in rows n+1 to n+m of column j in the to-be-encoded matrix are m bits comprised in check values that are generated based on bits in column j in the to-be-encoded matrix, 1≤i≤n, 1≤j≤n, elements in rows n+1 to n+m of column k in the to-be-encoded matrix are m bits comprised in check values that are generated based on elements in rows 1 to n of column p in the to-be-encoded matrix, n+1≤k≤n+m, and n+1≤p≤n+m; or elements in columns n+1 to n+m of row k in the to-be-encoded matrix are m bits comprised in check values that are generated based on elements in columns 1 to n of row p in the to-be-encoded matrix, n+1≤k≤n+m, and n+1≤p≤n+m.

Optionally, the m bits include a first check bit and a second check bit, the first check bit is a parity bit generated based on all elements in columns 1 to n of row i in the to-be-encoded matrix or all elements in rows 1 to n of column i in the to-be-encoded matrix, and the second check bit is a parity bit generated based on elements in even-numbered columns in columns 1 to n of row i in the to-be-encoded matrix or elements in even-numbered rows in rows 1 to n of column i in the to-be-encoded matrix.

Optionally, the first data includes 27436 bits, the second data includes 19600 bits, a value of n is 140, a value of m is 2, the quantity of the bits comprised in the first encoded sequence is 27556, and the quantity of the bits comprised in the second encoded sequence is 27556.

Optionally, both the 27436 bits comprised in the first data and the 19600 bits comprised in the second data may be consecutive bits in the to-be-encoded data, or may be inconsecutive bits in the to-be-encoded data.

The first data is encoded in the BCH encoding manner to generate the first encoded sequence. Before the second data is encoded in the product code encoding manner, check values (namely, the first check bit and the second check bit) of elements in each row or each column in a 140×140 matrix corresponding to the second data are determined, and a to-be-encoded 142×142 matrix comprising the check values is encoded in the product code encoding manner. The 27556 bits comprised in the finally generated second encoded sequence are used as the low bit of the input signal to perform PAM-4 modulation, and 27556 bits comprised in the generated first encoded sequence are used as the high bit of the input signal to perform PAM-4 modulation, so that when a redundancy rate is 17%, and a BER is $10^{-15}$, an encoding gain reaches 10.5 dB.

According to a second aspect, a decoding method is provided, and the method is performed by a decoding device, and includes: receiving a first symbol sequence, where the first symbol sequence is generated after a second symbol sequence is transmitted to the decoding device by using a transmission medium, the second symbol sequence is obtained by performing Four-level Pulse Amplitude Modulation PAM-4 modulation on an input signal, the input signal includes a first encoded sequence and a second encoded sequence, the first encoded sequence corresponds to a high bit of the input signal, and the second encoded sequence corresponds to a low bit of the input signal; demodulating the first symbol sequence to obtain a first to-be-decoded sequence; decoding the first to-be-decoded sequence in a first decoding manner to obtain first data; demodulating the first symbol sequence to obtain a second to-be-decoded sequence, where a quantity of bits comprised in the first to-be-decoded sequence is equal to a quantity of bits comprised in the second to-be-decoded sequence; and decoding the second to-be-decoded sequence in a second decoding manner to obtain second data, where a quantity of bits comprised in the first data is greater than a quantity of bits comprised in the second data. Optionally, the demodulating the first symbol sequence to obtain a first to-be-decoded sequence includes: demodulating the first symbol sequence based on the second data to obtain the first to-be-decoded sequence.

In a PAM-4 modulation manner, after a low bit signal in an input symbol sequence is modulated, an amplitude of a modulated signal corresponding to the low bit signal is relatively small, and after a high bit signal in the input symbol sequence is modulated, an amplitude of a modulated signal corresponding to the high bit signal is relatively large. Therefore, during a transmission process of the symbol sequence, an anti-interference capability of the high bit signal is stronger than that of the low bit signal. Therefore, when to-be-encoded data corresponding to the high bit signal is encoded, a relatively small quantity of redundant bits may be added.

In this embodiment of this application, the to-be-encoded data is divided into two parts (for example, the first data and the second data), so that the quantity of the bits comprised in the first data is greater than the quantity of the bits comprised in the second data, and the quantity of the bits comprised in the first encoded sequence (corresponding to a high bit of a modulated symbol sequence) that is obtained by encoding the first data in the first encoding manner is equal to the quantity of the bits comprised in the second encoded sequence (corresponding to a low bit of the modulated symbol sequence) that is obtained by encoding the second data in the second encoding manner.

Therefore, a quantity of redundant bits added when the first data is encoded in the first encoding manner is less than a quantity of redundant bits added when the second data is encoded in the second encoding manner. Compared with that an encoding manner (for example, the second encoding manner) with a relatively high error correction capability is used for encoding both the first data and the second data, the solutions of this application help reduce a quantity of redundant bits, help improve a code rate, and can reduce redundant information carried in the modulated symbol sequence.

Optionally, the demodulating the first symbol sequence based on the second data to obtain the first to-be-decoded sequence includes: determining a first amplitude and a second amplitude based on a first bit in the second data, where the first amplitude is equal to an amplitude of a symbol that is obtained by modulating the input signal through PAM-4 when the low bit and the high bit of the input signal are respectively equal to the first bit and 1, and the second amplitude is equal to an amplitude of a symbol that is obtained by modulating the input signal through PAM-4 when the low bit and the high bit of the input signal are respectively equal to the first bit and 0; determining a first absolute value and a second absolute value, where the first absolute value is equal to an absolute value of a difference between an amplitude of a first symbol and the first amplitude, the second absolute value is equal to an absolute value of a difference between the amplitude of the first symbol and the second amplitude, and the first symbol is a symbol that is in the first symbol sequence and that corresponds to the first bit; when the first absolute value is less than the second absolute value, determining that a value of a second bit in the first data is equal to 1, where the second bit is a bit corresponding to the first bit; and when the first absolute value is greater than the second absolute value, determining that a value of a second bit in the first data is equal to 0, where the second bit is the bit corresponding to the first bit.

The decoding device first obtains, by demodulating the first symbol sequence, the second to-be-decoded sequence corresponding to the low bit, and decodes the second to-be-decoded sequence to obtain the second data that is before encoding and that corresponds to the low bit; and then demodulates the first symbol sequence based on the second data to obtain the first to-be-decoded sequence corresponding to the high bit, and decodes the second to-be-decoded sequence to obtain the first data that is before encoding and that corresponds to the high bit. An error correction capability of the second to-be-decoded sequence corresponding to the low bit is stronger than an error correction capability of the first to-be-decoded sequence corresponding to the high bit. Therefore, first decoding the second to-be-decoded sequence corresponding to the low bit, and then demodulating the first symbol sequence to obtain the first to-be-decoded sequence based on the decoded second data that is before encoding and that corresponds to the low bit can improve accuracy in decoding the first to-be-decoded sequence corresponding to the high bit.

Optionally, the quantity of the bits comprised in the first to-be-decoded sequence is 6500, and the quantity of the bits comprised in the second to-be-decoded sequence is 6500; or the quantity of the bits comprised in the first to-be-decoded sequence is 5376, and the quantity of the bits comprised in the second to-be-decoded sequence is 5376; or the quantity of the bits comprised in the first to-be-decoded sequence is 27556, and the quantity of the bits comprised in the second to-be-decoded sequence is 27556.

Optionally, when the quantity of the bits comprised in the first to-be-decoded sequence is 6500, and the quantity of the bits comprised in the second to-be-decoded sequence is 6500, the first data includes 6448 bits, and the second data includes 5668 bits; or when the quantity of the bits comprised in the first to-be-decoded sequence is 5376, and the quantity of the bits comprised in the second to-be-decoded sequence is 5376, the first data includes 5324 bits, and the second data includes 4700 bits; or when the quantity of the bits comprised in the first to-be-decoded sequence is 27556, and the quantity of the bits comprised in the second to-be-decoded sequence is 27556, the first data includes 27436 bits, and the second data includes 19600 bits.

Optionally, the first decoding manner is a BCH decoding manner, and the second decoding manner is a product code decoding manner or the BCH decoding manner.

According to a third aspect, an encoding apparatus is provided, comprising modules configured to perform steps of the encoding method in the foregoing first aspect and implementations of the first aspect.

According to a fourth aspect, an encoding device is provided, comprising an encoding circuit, a modulation circuit, and a transmitter circuit. The encoding circuit is configured to encode first data in a first encoding manner to generate a first encoded sequence; the encoding circuit is further configured to encode second data in a second encoding manner to generate a second encoded sequence, where a quantity of bits comprised in the first data is greater than a quantity of bits comprised in the second data, and a quantity of bits comprised in the first encoded sequence is equal to a quantity of bits comprised in the second encoded sequence; the modulation circuit is configured to perform Four-level Pulse Amplitude Modulation PAM-4 modulation on an input signal to generate a symbol sequence, where the input signal includes the first encoded sequence and the second encoded sequence, the first encoded sequence corresponds to a high bit of the input signal, and the second encoded sequence corresponds to a low bit of the input signal; and the transmitter circuit is configured to send the symbol sequence.

According to a fifth aspect, an encoding device is provided. The encoding device includes a processor and a memory. The processor is configured to invoke a program stored in the memory to perform the encoding method in the first aspect or any possible implementation of the first aspect.

According to a sixth aspect, a computer program product is provided. The computer program product includes computer program code. When the computer program code is run by a processing unit and a communications unit or by a processor and a transceiver of an encoding device, the encoding device is enabled to perform the encoding method in any one of the first aspect and the implementations of the first aspect.

According to a seventh aspect, a computer readable storage medium is provided. The computer readable storage medium stores a program, and the program enables an encoding device to perform the encoding method in any one of the first aspect and the implementations of the first aspect.

According to an eighth aspect, a chip system is provided, comprising a memory and a processor. The memory is configured to store a computer program, and the processor is configured to invoke the computer program from the memory and run the computer program, so that an encoding device on which the chip system is installed performs the encoding method in any one of the first aspect and the implementations of the first aspect.

According to a ninth aspect, a decoding apparatus is provided, comprising modules configured to perform steps of the decoding method in the foregoing second aspect and implementations of the second aspect.

According to a tenth aspect, a decoding device is provided, comprising a receiver circuit, a demodulation circuit, and a decoding circuit. The receiver circuit is configured to receive a first symbol sequence, where the first symbol sequence is generated after a second symbol sequence is transmitted to the decoding device by using a transmission medium, the second symbol sequence is obtained by performing Four-level Pulse Amplitude Modulation PAM-4 modulation on an input signal, the input signal includes a first encoded sequence and a second encoded sequence, the first encoded sequence corresponds to a high bit of the input signal, and the second encoded sequence corresponds to a low bit of the input signal; the demodulation circuit is configured to demodulate the first symbol sequence to obtain a first to-be-decoded sequence; and the decoding circuit is further configured to decode the first to-be-decoded sequence in a first decoding manner to obtain first data. The decoding circuit is further configured to demodulate the first symbol sequence to obtain a second to-be-decoded sequence, where a quantity of bits comprised in the first to-be-decoded sequence is equal to a quantity of bits comprised in the second to-be-decoded sequence; and the decoding circuit is configured to decode the second to-be-decoded sequence in a second decoding manner to obtain second data, where a quantity of bits comprised in the first data is greater than a quantity of bits comprised in the second data.

According to an eleventh aspect, a decoding device is provided. The decoding device includes a processor and a memory. The processor is configured to invoke a program stored in the memory to perform the decoding method in the second aspect or any possible implementation of the second aspect.

According to a twelfth aspect, a computer program product is provided. The computer program product includes computer program code. When the computer program code is run by a processing unit and a communications unit or by a processor and a transceiver of a decoding device, the decoding device is enabled to perform the decoding method in any one of the second aspect and the implementations of the second aspect.

According to a thirteenth aspect, a computer readable storage medium is provided. The computer readable storage medium stores a program, and the program enables a decoding device to perform the decoding method in any one of the second aspect and the implementations of the second aspect.

According to a fourteenth aspect, a chip system is provided, comprising a memory and a processor. The memory is configured to store a computer program, and the processor is configured to invoke the computer program from the memory and run the computer program, so that a decoding device on which the chip system is installed performs the decoding method in any one of the second aspect and the implementations of the second aspect.

According to a fifteenth aspect, a system is provided. The system includes the encoding apparatus according to the third aspect and the decoding apparatus according to the ninth aspect, or the system includes the encoding device according to the fourth aspect and the decoding device according to the tenth aspect, or the system includes the encoding device according to the fifth aspect and the decoding device according to the eleventh aspect.

DESCRIPTION OF EMBODIMENTS

The following describes the technical solutions of this application with reference to the accompanying drawings.

Figure 1:
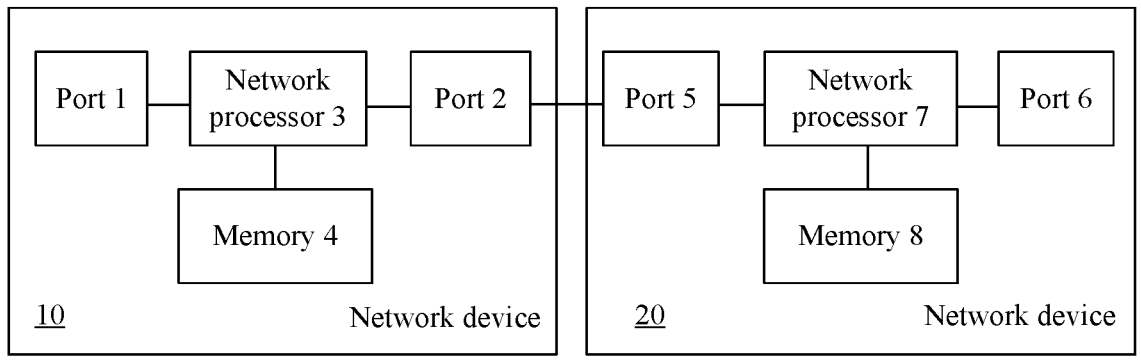
FIG. 1 is a schematic block diagram of a network according to an embodiment of this application.

FIG. 1 is a schematic diagram of a network according to this application. Referring to FIG. 1, the network includes a network device 10 and a network device 20. The network device 10 includes a port 1, a network processor 3, a port 2, and a memory 4. The port 1, the port 2, and the memory 4 are coupled with the network processor 3 by using a communications bus. The network device 20 includes a port 5, a network processor 7, a port 6, and a memory 8. The port 5, the port 6, and the memory 8 are coupled with the network processor 7 by using a communications bus.

The network device 10 and the network device 20 may be routers. The network device 10 and the network device 20 may be network switches. The network device 10 may receive a packet 1 by using the port 1. The network processor 3 may search a lookup table 1 stored in the memory 4 for an entry that matches the packet 1. The network processor 3 may determine, based on the matched entry, that a port configured to forward the packet 1 is the port 2. Further, the network device 10 may forward the packet 1 to the network device 20 by using the port 2. For example, the packet 1 may be an Ethernet frame or an Internet Protocol (IP) packet. The lookup table 1 may be a Media Access Control (MAC) table or a routing table.

The network device 10 may be directly connected to the network device 20 by using a transmission medium. The network device 10 may alternatively be indirectly connected to the network device 20 by using a transmission medium and another network device. The another network device may be a router, a network switch, or a repeater.

The network device 20 receives, by using the port 5, the packet 1 sent by the network device 10. The network device 20 may use a forwarding table stored in the network processor 7 and the memory 8 to determine that a port configured to forward the packet 1 is the port 6. For a specific implementation in which the network device 20 determines a port configured to forward the packet 1, refer to the foregoing description about the specific implementation in which the network device 10 determines a port configured to forward the packet 1. Details are not described herein again.

When the network device 10 sends data (for example, the packet 1) to the network device 20, the network device 10 may encode and modulate the data. Specifically, the network device 10 may send a symbol sequence to the network device 20 by using a transmission medium. After receiving the symbol sequence sent by the network device 10, the network device 20 may demodulate and decode the symbol sequence, to obtain the packet 1. The following describes encoding, modulation, demodulation, and decoding in detail with reference to FIG. 2 and FIG. 3.

Figure 2:
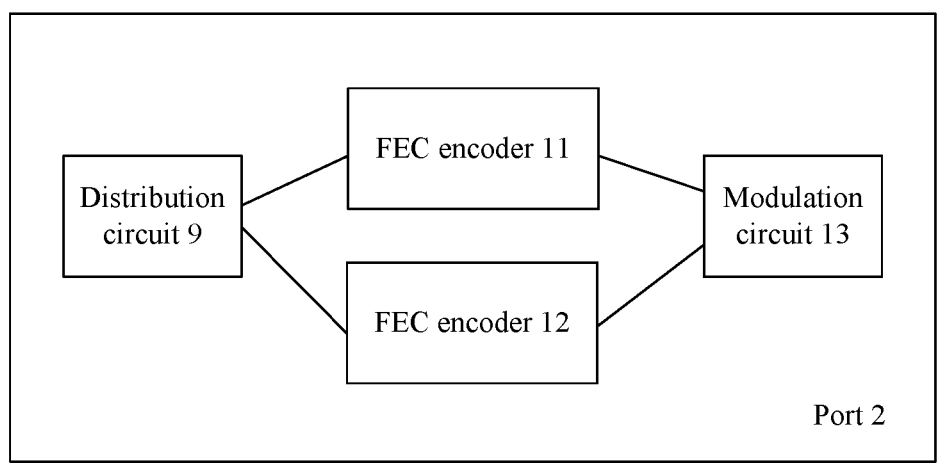
FIG. 2 is a possible schematic structural diagram of a port 2 in FIG. 1.

FIG. 2 is a possible schematic structural diagram of the port 2 in FIG. 1. Referring to FIG. 2, the port 2 includes a distribution circuit 9, a FEC encoder 11, a FEC encoder 12, and a modulation circuit 13. Output ends of the distribution circuit 9 are respectively connected to input ends of the FEC encoder 11 and the FEC encoder 12. Output ends of the FEC encoder 11 and the FEC encoder 12 are respectively connected to input ends of the modulation circuit 13. In a possible design, the distribution circuit 9, the FEC encoder 11, the FEC encoder 12, and the modulation circuit 13 may be integrated into a chip. The chip may be an ASIC or an FPGA. When the network device 10 needs to send data (for example, the packet 1) to the network device 20, the network processor 3 may provide the packet 1 to the port 2. After receiving the packet 1, the distribution circuit 9 may distribute a segment 1 in the packet 1 to the FEC encoder 11, and distribute a segment 2 in the packet 1 to the FEC encoder 12. The packet 1 includes the segment 1 and the segment 2. The FEC encoder 11 encodes the segment 1 to obtain an encoded sequence 1. The FEC encoder 12 encodes the segment 2 to obtain an encoded sequence 2. The FEC encoder 11 sends the encoded sequence 1 to the modulation circuit 13. The FEC encoder 12 sends the encoded sequence 2 to the modulation circuit 13. The encoded sequence 1 and the encoded sequence 2 are an input signal of the modulation circuit 13. For example, the modulation circuit 13 may be a PAM-4 modulator. The encoded sequence 1 corresponds to a high bit of the input signal of the modulation circuit 13. The encoded sequence 2 corresponds to a low bit of the input signal of the modulation circuit 13. After the modulation circuit 13 modulates the input signal, a symbol sequence is generated. The modulation circuit 13 sends the symbol sequence to the network device 20 by using a transmission medium. The transmission medium may be a cable. In a possible design, the port 2 may further include an electrical-to-optical converter. The electrical-to-optical converter may convert the symbol sequence provided by the modulation circuit 13 from an electrical signal into an optical signal. The electrical-to-optical converter may send the optical signal to the network device 20 by using a transmission medium. In a possible design, the port 2 may further include another circuit, for example, may further include a scrambling circuit and an alignment word insertion circuit. After the port 2 receives the packet 1 provided by the network processor 3, another circuit in the port 2 may process the packet 1. After the packet 1 is processed by the another circuit, the processed packet 1 is provided to the distribution circuit 9. For example, before reaching the distribution circuit 9, the packet 1 may be scrambled, and an alignment word may be inserted into the packet 1.

Figure 3:
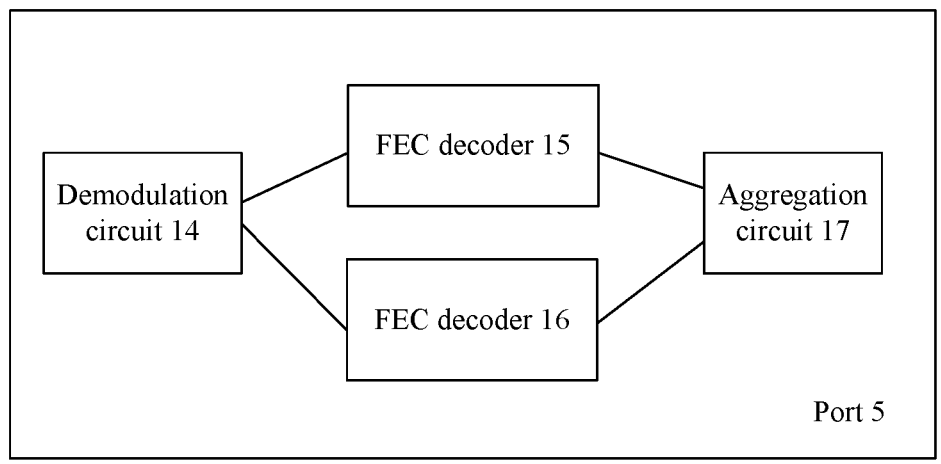
FIG. 3 is a possible schematic structural diagram of a port 5 in FIG. 1.

FIG. 3 is a possible schematic structural diagram of the port 5 in FIG. 1. Referring to FIG. 3, the port 5 includes an aggregation circuit 17, a FEC decoder 15, a FEC decoder 16, and a demodulation circuit 14. Input ends of the aggregation circuit 17 are respectively connected to output ends of the FEC decoder 15 and the FEC decoder 16. Input ends of the FEC decoder 15 and the FEC decoder 16 are respectively connected to output ends of the demodulation circuit 14. In a possible design, the aggregation circuit 17, the FEC decoder 15, the FEC decoder 16, and the demodulation circuit 14 may be integrated into a chip. The chip may be an ASIC or an FPGA. The network device 20 receives, by using a transmission medium, a symbol sequence sent by the modulation circuit 13. The demodulation circuit 14 may be a PAM-4 demodulator. The demodulation circuit 14 may demodulate the symbol sequence to generate an encoded sequence 1 and an encoded sequence 2. The encoded sequence 1 and the encoded sequence 2 are an output signal of the demodulation circuit 14. Specifically, the encoded sequence 1 corresponds to a high bit of the output signal of the demodulation circuit 14. The encoded sequence 2 corresponds to a low bit of the output signal of the demodulation circuit 14. The demodulation circuit 14 sends the encoded sequence 1 to the FEC decoder 15, and sends the encoded sequence 2 to the FEC decoder 16. The FEC decoder 15 decodes the encoded sequence 1 to generate a segment 1. The FEC decoder 16 decodes the encoded sequence 2 to generate a segment 2. The FEC decoder 15 sends the segment 1 to the aggregation circuit 17. The FEC decoder 16 sends the segment 2 to the aggregation circuit 17. The aggregation circuit 17 aggregates the segment 1 and the segment 2, to obtain a packet 1. The aggregation circuit 17 sends the packet 1 to the network processor 7. An encoding manner used by the FEC encoder 11 corresponds to a decoding manner used by the FEC decoder 15. An encoding manner used by the FEC encoder 12 corresponds to a decoding manner used by the FEC decoder 16. A gain of the encoding manner used by the FEC encoder 11 may be different from a gain of the encoding manner used by the FEC encoder 12. In a possible design, the port 5 may include an optical-to-electrical converter. Specifically, when receiving an optical signal from the network device 10 by using a transmission medium (for example, an optical fiber), the network device 20 may use the optical-to-electrical converter to convert the optical signal to an electrical signal. Further, the demodulation circuit 14 may demodulate a symbol sequence in a form of an electrical signal. In a possible design, the packet 1 generated by the aggregation circuit 17 may be a scrambled packet 1 into which an alignment word is inserted. The port 5 may further include an alignment word deletion circuit and a descrambling circuit. The alignment word deletion circuit may delete an alignment word in data provided by the aggregation circuit 17. The descrambling circuit may descramble scrambled data. Further, the port 5 may provide a descrambled packet 1 that does not include an alignment word to the network processor 7.

Figure 4:
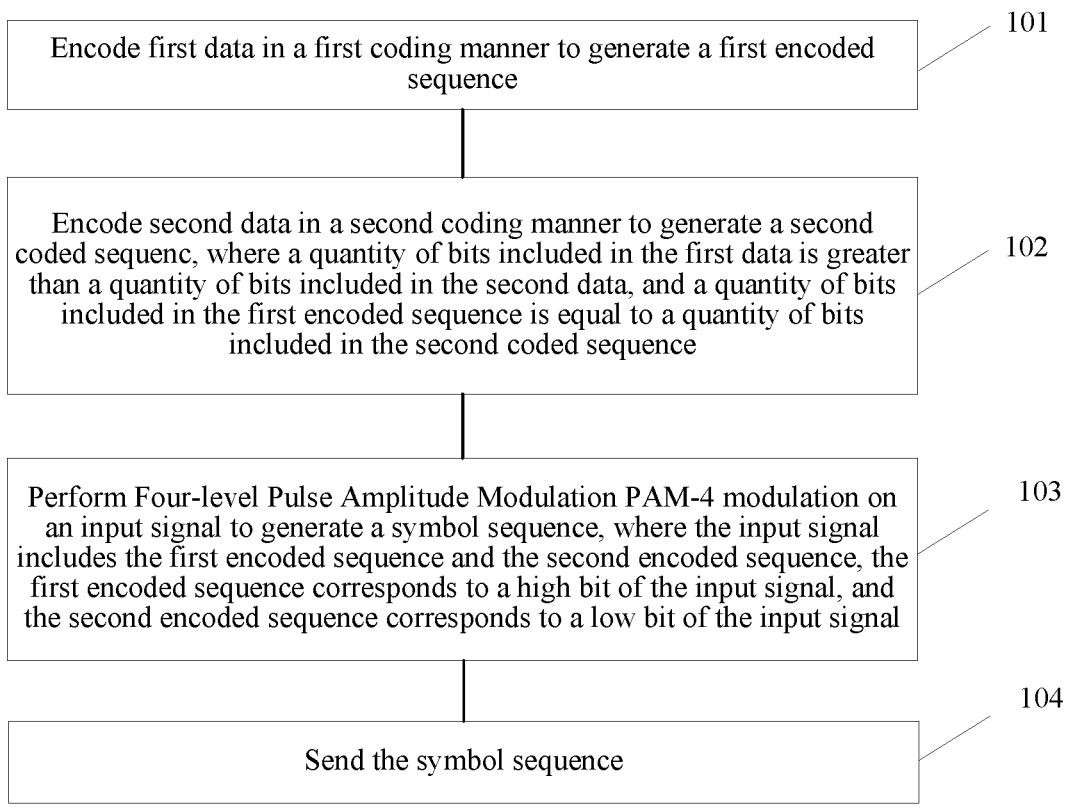
FIG. 4 is a schematic flowchart of an encoding method according to an embodiment of this application.

FIG. 4 is a schematic flowchart of an encoding method 100 according to an embodiment of this application. The method 100 includes 101, 102, 103, and 104, and the method 100 is performed by an encoding device. For example, the encoding device may be the network device 10 in FIG. 1. Specifically, the port 2 in FIG. 2 may be configured to perform the encoding method 100.

101. Encode first data in a first encoding manner to generate a first encoded sequence.

For example, a FEC encoder 11 may be configured to perform 101. A segment 1 may be the first data. An encoded sequence 1 may be the first encoded sequence.

102. Encode second data in a second encoding manner to generate a second encoded sequence, where a quantity of bits comprised in the first data is greater than a quantity of bits comprised in the second data, and a quantity of bits comprised in the first encoded sequence is equal to a quantity of bits comprised in the second encoded sequence.

For example, a FEC encoder 12 may be configured to perform 102. A segment 2 may be the second data. An encoded sequence 2 may be the second encoded sequence.

Specifically, the encoding device encodes some bits (for example, the first data) of bits comprised in to-be-encoded data in the first encoding manner, and encodes other bits (for example, the second data) different from the bits comprised in the first data in the to-be-encoded data in the second encoding manner. The quantity of the bits comprised in the first data is greater than the quantity of the bits comprised in the second data, and the bits in the first data do not overlap the bits in the second data.

For example, the encoding device determines $k_1$ bits in $k_1+k_2$ ($k_1$ is greater than $k_2$, $k_1 \geq 1$, and $k_2 \geq 1$) bits comprised in the to-be-encoded data as the first data, and determines remaining $k_2$ bits in the to-be-encoded data as the second data.

The encoding device encodes the $k_1$ bits comprised in the first data in the first encoding manner to generate an encoded sequence (for example, the first encoded sequence) that includes x ($x>k_1+k_2$) bits, and encodes $k_2$ bits comprised in the second data in the second encoding manner to generate an encoded sequence (for example, the second encoded sequence) that includes x ($x>k_1+k_2$) bits.

By way of example but not limitation, the to-be-encoded data may be an Internet Protocol (IP) packet, an Ethernet frame, or a Multiprotocol Label Switching (MPLS) packet.

It should be noted that, the foregoing merely uses the to-be-encoded data that includes $k_1+k_2$ bits as an example for description. However, this embodiment of this application is not limited thereto. A quantity of bits comprised in the to-be-encoded data may alternatively be greater than $k_1+k_2$. In other words, only some bits in the bits comprised in the to-be-encoded data are determined as the first data and the second data.

It should be further noted that, the foregoing merely uses the first data and the second data that come from the same to-be-encoded data as an example for description. However, this embodiment of this application is not limited thereto. For example, the first data and the second data may respectively come from different to-be-encoded data.

103. Perform Four-level Pulse Amplitude Modulation (Pulse Amplitude Modulation, PAM-4) modulation on an input signal to generate a symbol sequence, where the input signal includes the first encoded sequence and the second encoded sequence, the first encoded sequence corresponds to a high bit of the input signal, and the second encoded sequence corresponds to a low bit of the input signal.

For example, a modulation circuit 13 may be configured to perform 103. The modulation circuit 13 may modulate the input signal, to obtain the symbol sequence. The input signal includes the encoded sequence 1 and the encoded sequence 2. The encoded sequence 1 corresponds to the high bit of the input signal. The encoded sequence 2 corresponds to the low bit of the input signal. Specifically, the modulation circuit 13 may modulate a bit in the encoded sequence 1 and a bit in the encoded sequence 2 to generate a symbol sequence. A quantity of bits comprised in the encoded sequence 1 is equal to a quantity of bits comprised in the encoded sequence 2. There is a one-to-one correspondence between the plurality of the bits in the encoded sequence 1 and the plurality of the bits in the encoded sequence 2.

104. Send the symbol sequence.

For example, the modulation circuit 13 may be configured to perform 104. The modulation circuit may send the symbol sequence to a remote device by using a transmission medium. The transmission medium may be a cable or an optical fiber. When the transmission medium is an optical fiber, the port 2 may further include an electrical-to-optical converter. The electrical-to-optical converter may be comprised in an optical module. The electrical-to-optical converter performs an electrical-to-optical conversion on the symbol sequence generated by the modulation circuit 13, to obtain a symbol sequence in a form of an electrical signal. The electrical-to-optical converter sends the symbol sequence to the remote device by using the optical fiber. The remote device may be the network device 20 in FIG. 1.

Specifically, in step 101 and step 102, the encoding device encodes the first data and the second data in different encoding manners respectively, to generate the first encoded sequence and the second encoded sequence.

In step 103, the encoding device performs PAM-4 modulation on the input signal comprising the first encoded sequence and the second encoded sequence, where the first encoded sequence is used as the high bit of the input signal and the second encoded sequence is used as the low bit of the input signal for PAM-4 modulation, to generate the modulated symbol sequence.

In step 104, the encoding device sends, to a decoding device, the symbol sequence obtained by performing PAM-4 modulation on the first encoded sequence and the second encoded sequence.

By way of example but not limitation, the encoding device may be any one of a router, a network switch, a base station, a base station controller, a firewall, a load balancer, or a packet transport network (Packet Transport Network, PTN) device.

By way of example but not limitation, the decoding device may be a device of a same type as the encoding device.

It should be noted that, in this embodiment of this application, the encoding device and the decoding device pre-agree on encoding manners and error correction capabilities of the first encoded sequence and the second encoded sequence, so that when receiving the symbol sequence, the decoding device can decode the symbol sequence based on the pre-agreed encoding manners and error correction capabilities.

In a PAM-4 modulation manner, after a low bit signal in an input symbol sequence is modulated, an amplitude of a modulated signal corresponding to the low bit signal is relatively small, and after a high bit signal in the input symbol sequence is modulated, an amplitude of a modulated signal corresponding to the high bit signal is relatively large. Therefore, during a transmission process of the symbol sequence, an anti-interference capability of the high bit signal is stronger than that of the low bit signal. Therefore, when to-be-encoded data corresponding to the high bit signal is encoded, a relatively small quantity of redundant bits may be added.

In this embodiment of this application, the to-be-encoded data is divided into two parts (for example, the first data and the second data), so that the quantity of the bits comprised in the first data is greater than the quantity of the bits comprised in the second data, and the quantity of the bits comprised in the first encoded sequence (corresponding to a high bit of a modulated symbol sequence) that is obtained by encoding the first data in the first encoding manner is equal to the quantity of the bits comprised in the second encoded sequence (corresponding to a low bit of the modulated symbol sequence) that is obtained by encoding the second data in the second encoding manner.

Therefore, a quantity of redundant bits added when the first data is encoded in the first encoding manner is less than a quantity of redundant bits added when the second data is encoded in the second encoding manner. Compared with that an encoding manner (for example, the second encoding manner) with a relatively high error correction capability is used for encoding both the first data and the second data, the solutions of this application help reduce a quantity of redundant bits, help improve a code rate, and can reduce redundant information carried in the modulated symbol sequence. The following describes several cases of the encoding method provided in this embodiment of this application in detail by using PAM-4 modulation as an example.

Case 1

By way of example but not limitation, the first data includes 27436 bits, and second data includes 19600 bits. The encoding device encodes the first data in a BCH encoding manner, where the quantity of the bits comprised in the generated first encoded sequence is 27556; and encodes the second data in a product code encoding manner, where the quantity of the bits comprised in the generated second encoded sequence is 27556.

Specifically, a quantity of bits comprised in the to-be-encoded data is 47036. The encoding device encodes 27436 bits in the 47036 bits in the BCH encoding manner, and the quantity of the bits comprised in the generated first encoded sequence is 27556. The first encoded sequence includes 27436 information bits and 120 check bits, an error correction capability t is 8, and the first encoded sequence is denoted as BCHi (27556, 27436, t=8).

The encoding device encodes 19600 bits other than the 27436 bits in the 47036 bits in the product code encoding manner, and the quantity of the bits comprised in the generated second encoded sequence is 27556.

The following describes a specific method for encoding the second data by the encoding device by using a product code.

By way of example but not limitation, the second encoded sequence is obtained by encoding a to-be-encoded matrix in the product code encoding manner, where the to-be-encoded matrix is an (n+m)×(n+m) matrix, n≥2, m≥1, both m and n are integers, elements in columns 1 to n of each row in rows 1 to n in the to-be-encoded matrix are bits in the second data, elements in columns n+1 to n+m of row i in the to-be-encoded matrix are m bits comprised in check values that are generated based on bits in row i in the to-be-encoded matrix, elements in rows n+1 to n+m of column j in the to-be-encoded matrix are m bits comprised in check values that are generated based on bits in column j in the to-be-encoded matrix, 1≤i≤n, and 1≤j≤n.

Elements in rows n+1 to n+m of column k in the to-be-encoded matrix are m bits comprised in check values that are generated based on elements in rows 1 to n of column p in the to-be-encoded matrix, where n+1≤k≤n+m, and n+1≤p≤n+m; or elements in columns n+1 to n+m of row k in the to-be-encoded matrix are m bits comprised in check values that are generated based on elements in columns 1 to n of row p in the to-be-encoded matrix, where n+1≤k≤n+m, and n+1≤p≤n+m.

By way of example but not limitation, the m bits include a first check bit and a second check bit, the first check bit is a parity bit generated based on all elements in columns 1 to n of row i in the to-be-encoded matrix or all elements in rows 1 to n of column i in the to-be-encoded matrix, and the second check bit is a parity bit generated based on elements in even-numbered columns in columns 1 to n of row i in the to-be-encoded matrix or elements in even-numbered rows in rows 1 to n of column i in the to-be-encoded matrix.

In this embodiment of this application, when the quantity of the bits comprised in the second data is 19600, a value of n is 140, and a value of m is 2.

Specifically, before the encoding device encodes the second data in the product code encoding manner, the to-be-encoded matrix of the second data needs to be obtained first.

Figure 5:
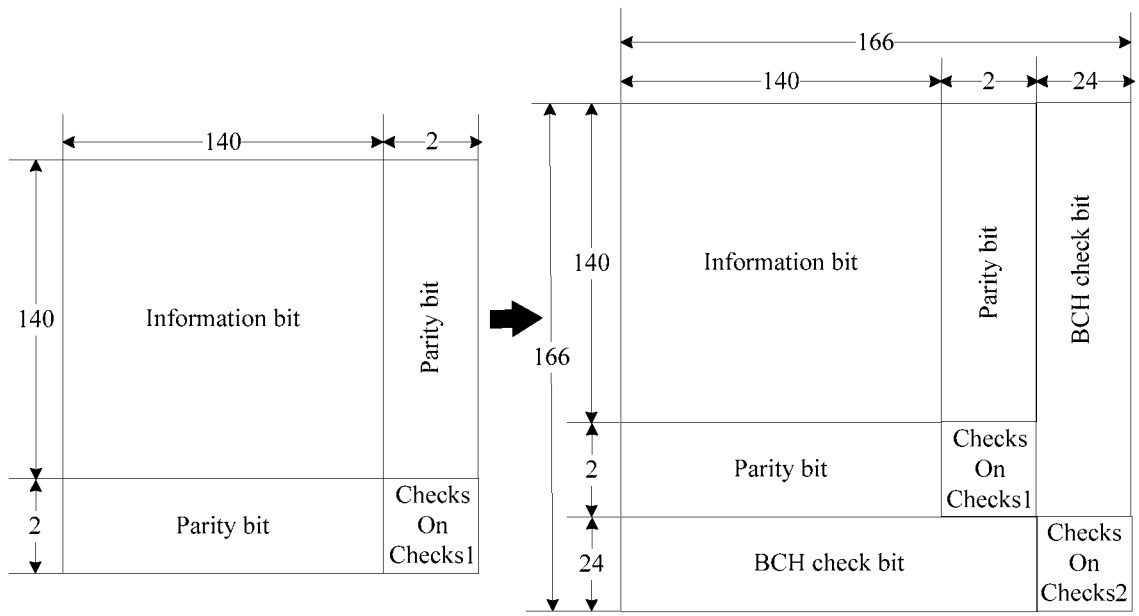
FIG. 5 is a schematic principle diagram of a product code encoding manner according to an embodiment of this application.

As shown in FIG. 5, the to-be-encoded matrix is a 142×142 matrix, where elements in columns 1 to 140 of each row in the first 140 rows in the to-be-encoded matrix are some bits in 19600 bits comprised in the second data, and elements in rows 1 to 140 of each column in the first 140 columns in the to-be-encoded matrix are some bits in the 19600 bits comprised in the second data. In other words, any bit in the 19600 bits comprised in the second data is a unique element in the to-be-encoded matrix.

Elements in columns 141 to 142 of each row in the first 140 rows in the to-be-encoded matrix are the first check bit and the second check bit generated based on bits in the same row in the to-be-encoded matrix, and elements in rows 141 to 142 of each column in the first 140 columns in the to-be-encoded matrix are the first check bit and the second check bit generated based on bits in the same column in the to-be-encoded matrix.

For example, elements in columns 141 to 142 of row 1 in the to-be-encoded matrix are the first check bit and the second check bit generated based on bits in columns 1 to 140 of row 1 in the to-be-encoded matrix, and elements in rows 141 to 142 of column 1 in the to-be-encoded matrix are the first check bit and the second check bit generated based on bits in rows 1 to 140 of column 1 in the to-be-encoded matrix.

Elements in row 141 and row 142 of column 141 in the to-be-encoded matrix are the first check bit and the second check bit generated based on elements in the first 140 rows of column 141, and elements in row 141 and row 142 of column 142 in the to-be-encoded matrix are the first check bit and the second check bit generated based on elements in the first 140 rows of column 142; or elements in column 141 and column 142 of row 141 in the to-be-encoded matrix are the first check bit and the second check bit generated based on elements in the first 140 columns of row 141, and elements in column 141 and column 142 of row 142 in the to-be-encoded matrix are the first check bit and the second check bit generated based on elements in the first 140 columns of row 142.

Elements in columns 141 to 142 of rows 141 to 142 in the to-be-encoded matrix are shown in a Checks On Checks1 area in FIG. 5.

140 bits in each row in the first 140 rows or each column in the first 140 columns in the to-be-encoded matrix are represented as $\{c_1, c_2, \ldots, c_{140}\}$. In this case, the first check bit generated based on the 140 bits in each row or each column may be represented as $c_{141}=C_1 \oplus C_2 \oplus C_3 \oplus C_{140}$ and the second check bit generated based on the 140 bits in each row or each column may be represented as $C_{142}=C_2 \oplus c_4 \oplus c_6 \oplus \ldots \oplus c_{140}$.

The encoding device encodes 142 bits in each row and each column in the to-be-encoded matrix in the BCH encoding manner, and adds 24 BCH check bits to each row and each column during encoding. In other words, after the to-be-encoded matrix is encoded in the BCH encoding manner, a matrix corresponding to the generated second encoded sequence is 166×166, and the quantity of the bits comprised in the second encoded sequence is 27556.

Elements in columns 143 to 166 of each row in rows 143 to 166 in the 166×166 matrix may be BCH check bits generated based on elements in the first 142 columns of the same row, or elements in rows 143 to 166 of each column in columns 143 to 166 in the 166×166 matrix may be BCH check bits generated based on elements in the first 142 rows of the same column.

Elements in columns 143 to 166 of rows 143 to 166 in the to-be-encoded matrix are shown in a Checks On Checks2 area in FIG. 5.

It should be noted that, the foregoing merely uses generation of one first check bit and one even parity bit for each row or each column in the to-be-encoded matrix as an example for description. However, this embodiment of this application is not limited thereto. For example, more than two check bits of another type may alternatively be generated for each row or each column in the to-be-encoded matrix.

Figure 6:
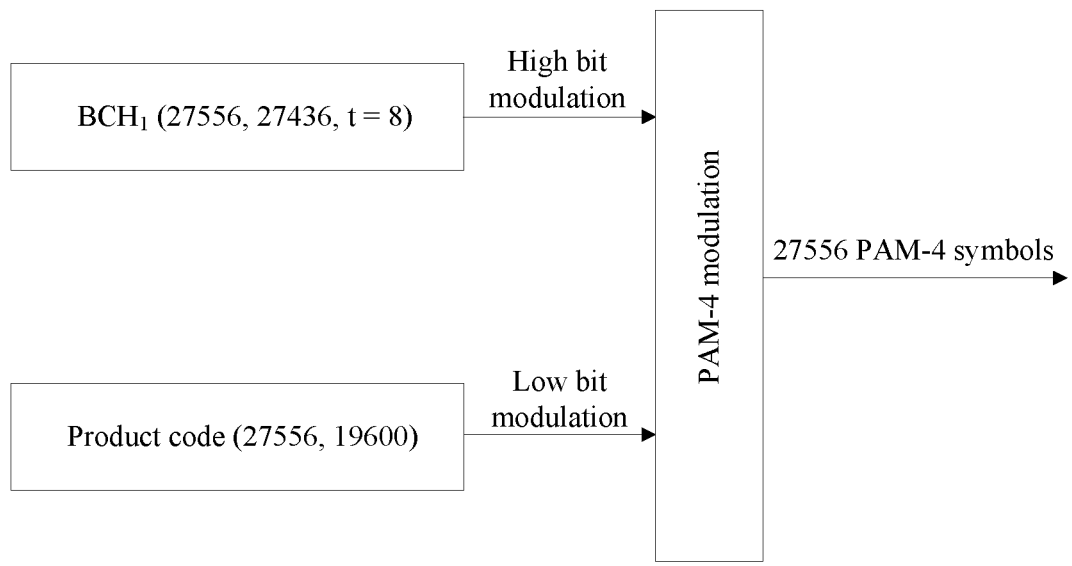
FIG. 6 is a schematic principle diagram of a BCH encoding manner according to an embodiment of this application.

As shown in FIG. 6, the encoding device uses 27556 bits comprised in the first encoded sequence as the high bit of the input signal, and uses 27556 bits comprised in the second encoded sequence as the low bit of the input signal to perform PAM-4 modulation; and finally sends, to the decoding device, a modulated symbol sequence having a length of 27556 bits.

It should be noted that, both the 27436 bits comprised in the first data and the 19600 bits comprised in the second data may be consecutive bits in the to-be-encoded data, or may be inconsecutive bits in the to-be-encoded data. This is not specially limited in this embodiment of this application.

The first data is encoded in the BCH encoding manner to generate the first encoded sequence. Before the second data is encoded in the product code encoding manner, check values (namely, the first check bit and the second check bit) of elements in each row or each column in a 140×140 matrix corresponding to the second data are determined, and a to-be-encoded 142×142 matrix comprising the check values is encoded in the product code encoding manner. The 27556 bits comprised in the finally generated second encoded sequence are used as the low bit of the input signal to perform PAM-4 modulation, and 27556 bits comprised in the generated first encoded sequence are used as the high bit of the input signal to perform PAM-4 modulation, so that when a redundancy rate is 17%, and a bit error rate (BER) is $10^{-15}$, an encoding gain reaches 10.5 dB.

In addition, for the first encoded sequence and the second encoded sequence that have a quantity of 55112 bits in total, when a transmission rate is 100 gigabits per second (Gbps), a delay after the decoding device receives a demodulated symbol sequence is about 0.5 microsecond (μs).

It should also be noted that, the quantity of the bits comprised in the to-be-encoded data, the quantity of the bits comprised in the first data, the quantity of the bits comprised in the second data, the quantity of the bits comprised in the first encoded sequence, the quantity of the bits comprised in the second encoded sequence, the first encoding manner, and the second encoding manner in the foregoing case 1 are merely used for illustrative description. Another implementation method that can implement an effect in the foregoing case 1 shall fall within the protection scope of this application.

If the 47036 bits comprised in the to-be-encoded data are encoded in the product code encoding manner, each component code of a product code is encoded in the BCH encoding manner, and a quantity of bits comprised in each component code is 217, and a quantity of bits comprised in each component code after encoding is 235, an obtained encoding gain is 9.6 dB.

Case 2

By way of example but not limitation, the first data includes 6448 bits, and the second data includes 5668 bits. The encoding device encodes the first data in a BCH encoding manner, where the quantity of the bits comprised in the generated first encoded sequence is 6500; and encodes the second data in the BCH encoding manner, where the quantity of the bits comprised in the generated second encoded sequence is 6500.

Specifically, a quantity of bits comprised in the to-be-encoded data is 12116. The encoding device encodes 6448 bits in the 12116 bits in the BCH encoding manner, and the quantity of the bits comprised in the generated first encoded sequence is 6500. The first encoded sequence includes 6448 information bits and 52 check bits, an error correction capability t is 4, and the first encoded sequence is denoted as BCH2 (6500, 6448, t=4).

The encoding device encodes 5668 bits other than the 6448 bits in the 12116 bits in the BCH encoding manner, and the quantity of the bits comprised in the generated second encoded sequence is 6500. The second encoded sequence includes 5668 information bits and 832 check bits, an error correction capability t is 64, and the second encoded sequence is denoted as BCH3 (6500, 5668, t=64).

Figure 7:
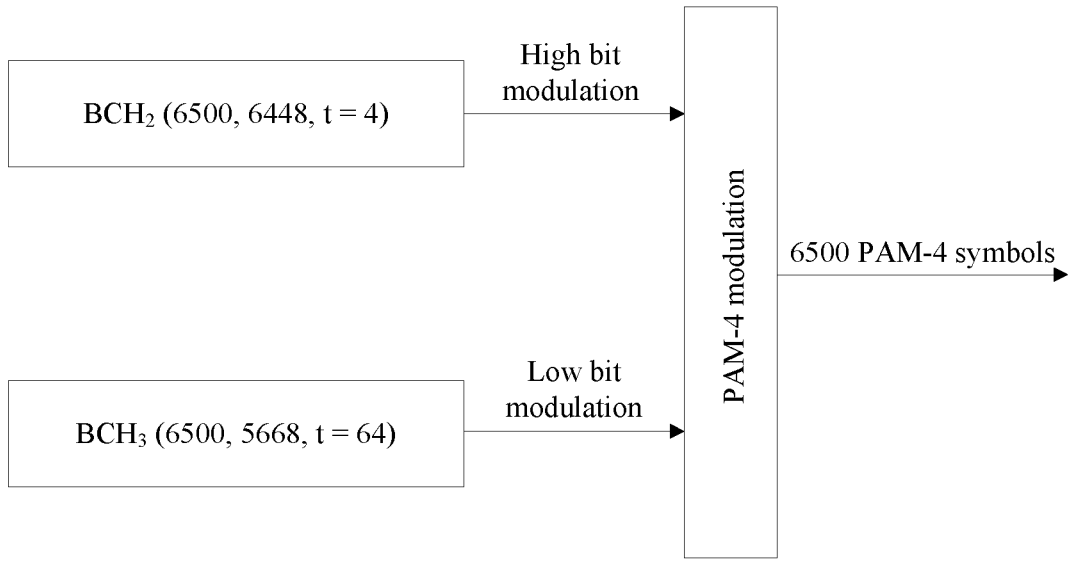
FIG. 7 is another schematic principle diagram of a BCH encoding manner according to an embodiment of this application.

As shown in FIG. 7, the encoding device uses 6500 bits comprised in the first encoded sequence as the high bit of the input signal, and uses 6500 bits comprised in the second encoded sequence as the low bit of the input signal to perform PAM-4 modulation; and finally sends, to the decoding device, a modulated symbol sequence having a length of 6500 bits.

It should be noted that, both the 6448 bits comprised in the first data and the 5668 bits comprised in the second data may be consecutive bits in the to-be-encoded data, or may be inconsecutive bits in the to-be-encoded data. This is not specially limited in this embodiment of this application.

The first data includes 6448 bits, the second data includes 5668 bits, and both the quantity of the bits comprised in the first encoded sequence and the quantity of the bits comprised in the second encoded sequence that are generated by respectively encoding the first data and the second data in the BCH encoding manner are 6500. The first encoded sequence is used as a high bit during PAM-4 modulation and the second encoded sequence is used as a low bit during PAM-4 modulation, so that when a redundancy rate is 7%, and a BER is $10^{-15}$, an encoding gain reaches 8.6 dB.

If the 12116 bits comprised in the to-be-encoded data are encoded in the BCH encoding manner, and a quantity of bits comprised in an encoded sequence obtained after encoding is 13021, an obtained encoding gain is 8.3 dB.

In addition, for the first encoded sequence and the second encoded sequence that have a quantity of 13000 bits in total, when a transmission rate is 100 Gbps, a delay after the decoding device receives a demodulated symbol sequence is about 100 nanoseconds (ns).

It should also be noted that, the quantity of the bits comprised in the to-be-encoded data, the quantity of the bits comprised in the first data, the quantity of the bits comprised in the second data, the quantity of the bits comprised in the first encoded sequence, the quantity of the bits comprised in the second encoded sequence, the first encoding manner, and the second encoding manner in the foregoing case 2 are merely used for illustrative description. Another implementation method that can implement an effect in the foregoing case 2 shall fall within the protection scope of this application.

Case 3

By way of example but not limitation, the first data includes 5324 bits, and the second data includes 4700 bits. The encoding device encodes the first data in a BCH encoding manner, where the quantity of the bits comprised in the generated first encoded sequence is 5376; and encodes the second data in the BCH encoding manner, where the quantity of the bits comprised in the generated second encoded sequence is 5376.

Specifically, a quantity of bits comprised in the to-be-encoded data is 10024. The encoding device encodes 5324 bits in the 10024 bits in the BCH encoding manner, and the quantity of the bits comprised in the generated first encoded sequence is 5376. The first encoded sequence includes 5324 information bits and 52 check bits, an error correction capability t is 4, and the first encoded sequence is denoted as BCH4 (5376, 5324, t=4).

The encoding device encodes 4700 bits other than the 5324 bits in the 10024 bits in the BCH encoding manner, and the quantity of the bits comprised in the generated second encoded sequence is 5376. The second encoded sequence includes 4700 information bits and 676 check bits, an error correction capability t is 52, and the second encoded sequence is denoted as BCH5 (5376, 4700, t=52).

Figure 8:
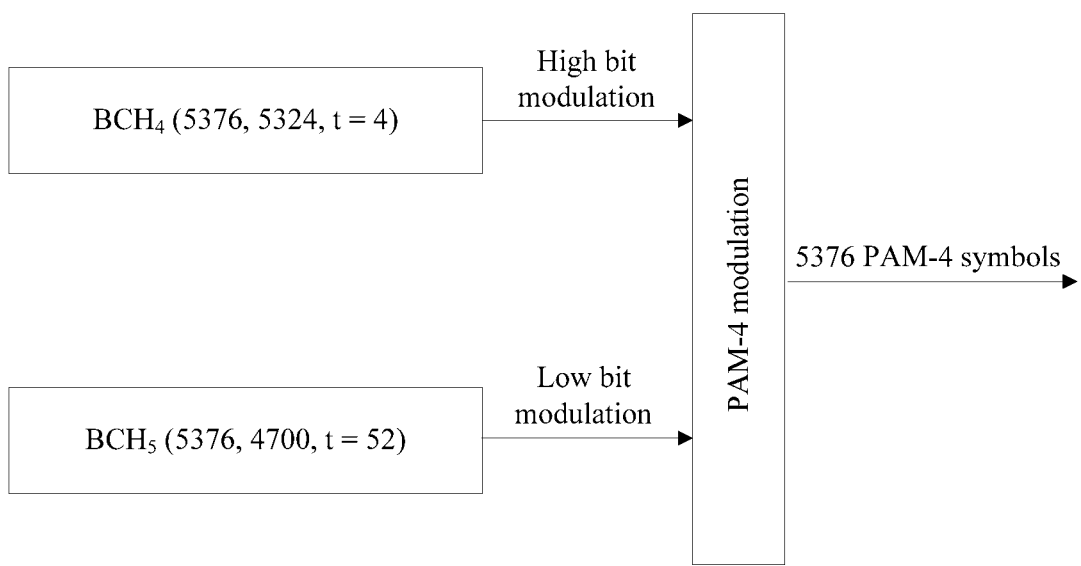
FIG. 8 is still another schematic principle diagram of a BCH encoding manner according to an embodiment of this application.

As shown in FIG. 8, the encoding device uses 5376 bits comprised in the first encoded sequence as the high bit of the input signal, and uses 5376 bits comprised in the second encoded sequence as the low bit of the input signal to perform PAM-4 modulation; and finally sends, to the decoding device, a modulated symbol sequence having a length of 5376 bits.

It should be noted that, both the 5324 bits comprised in the first data and the 4700 bits comprised in the second data may be consecutive bits in the to-be-encoded data, or may be inconsecutive bits in the to-be-encoded data. This is not specially limited in this embodiment of this application.

The first data includes 5324 bits, the second data includes 4700 bits, and both the quantity of the bits comprised in the first encoded sequence and the quantity of the bits comprised in the second encoded sequence that are generated by respectively encoding the first data and the second data in the BCH encoding manner are 5376. The first encoded sequence is used as a high bit during PAM-4 modulation and the second encoded sequence is used as a low bit during PAM-4 modulation, so that when a redundancy rate is 7%, and a BER is $10^{-15}$, an encoding gain reaches 8.45 dB.

If the 10024 bits comprised in the to-be-encoded data are encoded in the BCH encoding manner, and a quantity of bits comprised in an encoded sequence obtained after encoding is 10724, an obtained encoding gain is 8.1 dB.

In addition, for the first encoded sequence and the second encoded sequence that have a quantity of 10752 bits in total, when a transmission rate is 100 Gbps, a delay after the decoding device receives a demodulated symbol sequence is about 100 nanoseconds (ns).

It should also be noted that, the quantity of the bits comprised in the to-be-encoded data, the quantity of the bits comprised in the first data, the quantity of the bits comprised in the second data, the quantity of the bits comprised in the first encoded sequence, the quantity of the bits comprised in the second encoded sequence, the first encoding manner, and the second encoding manner in the foregoing case 3 are merely used for illustrative description. Another implementation method that can implement an effect in the foregoing case 3 shall fall within the protection scope of this application.

Figure 9:
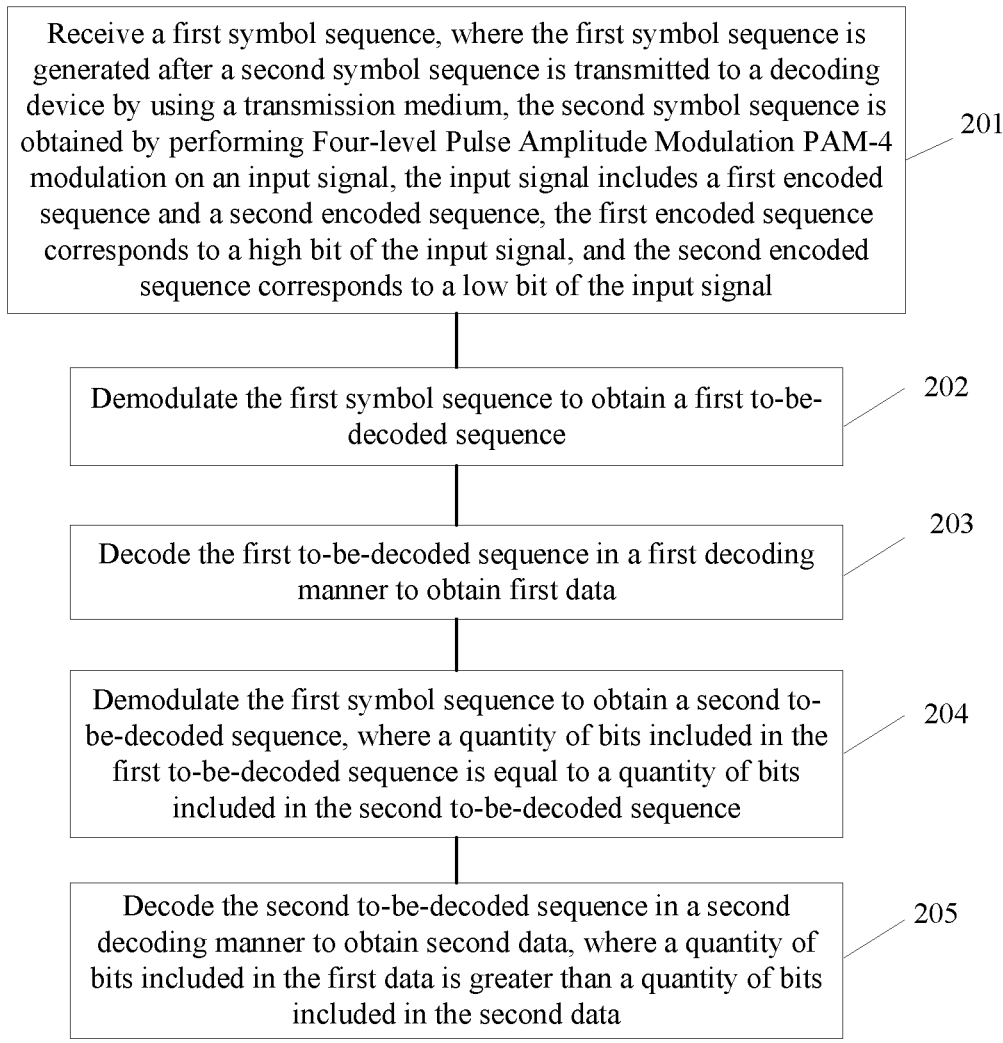
FIG. 9 is a schematic flowchart of a decoding method according to an embodiment of this application.

FIG. 9 is a schematic flowchart of a decoding method 200 according to an embodiment of this application. The method 200 includes 201, 202, 203, 204, and 205, and the method 200 is performed by a decoding device. For example, the decoding device may be the network device 20 in FIG. 1. Specifically, the port 5 in FIG. 3 may be configured to perform the method 200.

201. Receive a first symbol sequence, where the first symbol sequence is generated after a second symbol sequence is transmitted to the decoding device by using a transmission medium, the second symbol sequence is obtained by performing Four-level Pulse Amplitude Modulation PAM-4 modulation on an input signal, the input signal includes a first encoded sequence and a second encoded sequence, the first encoded sequence corresponds to a high bit of the input signal, and the second encoded sequence corresponds to a low bit of the input signal.

For example, a demodulation circuit 14 may be configured to perform 201. The demodulation circuit 14 may be a PAM-4 demodulator. The first symbol sequence may be a symbol sequence generated by a modulation circuit 13. The first symbol sequence may be a symbol sequence in a form of an electrical signal, or may be a symbol sequence in a form of an optical signal. Specifically, the demodulation circuit 14 may receive a symbol sequence from the modulation circuit 13 by using a transmission medium. In a possible implementation, when the first symbol sequence is a symbol sequence in a form of an optical signal, the port 5 may include an electrical-to-optical converter. The electrical-to-optical converter may convert the first symbol sequence in a form of an optical signal to a first symbol sequence in a form of an electrical signal. Further, the electrical-to-optical converter may provide the first symbol sequence in a form of an electrical signal to the demodulation circuit 14.

Specifically, the decoding device receives the first symbol sequence, where the first symbol sequence is generated after a symbol sequence (for example, the second symbol sequence) sent by an encoding device is transmitted to the decoding device by using a transmission medium, the second symbol sequence is obtained by performing Four-level Pulse Amplitude Modulation PAM-4 modulation on the input signal, the input signal includes the first encoded sequence and the second encoded sequence, the first encoded sequence corresponds to the high bit of the input signal, and the second encoded sequence corresponds to the low bit of the input signal.

202. Demodulate the first symbol sequence to obtain a first to-be-decoded sequence.

For example, the demodulation circuit 14 may be configured to perform 202. An output signal of the demodulation circuit 14 includes the first to-be-decoded sequence. The first to-be-decoded sequence corresponds to a high bit of the output signal.

203. Decode the first to-be-decoded sequence in a first decoding manner to obtain first data.

Specifically, after receiving the first symbol sequence, the decoding device demodulates the first symbol sequence to obtain the first to-be-decoded sequence, where the first to-be-decoded sequence is a corresponding sequence after the first encoded sequence is transmitted by using a transmission medium, and decodes the first to-be-decoded sequence to obtain the first data that is before encoding.

For example, a FEC decoder 15 may be configured to perform 203. A segment 1 may be the first data.

204. Demodulate the first symbol sequence to obtain a second to-be-decoded sequence, where a quantity of bits comprised in the first to-be-decoded sequence is equal to a quantity of bits comprised in the second to-be-decoded sequence.

For example, the demodulation circuit 14 may be configured to perform 204. The output signal of the demodulation circuit 14 includes the second to-be-decoded sequence. The second to-be-decoded sequence corresponds to a low bit of the output signal.

205. Decode the second to-be-decoded sequence in a second decoding manner to obtain second data, where a quantity of bits comprised in the first data is greater than a quantity of bits comprised in the second data.

For example, a FEC decoder 16 may be configured to perform 205. A segment 2 may be the second data.

Specifically, after receiving the first symbol sequence, the decoding device demodulates the first symbol sequence to obtain the second to-be-decoded sequence, where the second to-be-decoded sequence is a corresponding sequence after the second encoded sequence is transmitted by using a transmission medium, and decodes the second to-be-decoded sequence to obtain the second data that is before encoding.

In an optional implementation, that the decoding device demodulates the first symbol sequence to obtain the first to-be-decoded sequence includes: demodulating the first symbol sequence based on the second data to obtain the first to-be-decoded sequence.

Specifically, the decoding device demodulates the first symbol sequence to obtain the second to-be-decoded sequence first, decodes the second to-be-decoded sequence to obtain the second data, and demodulates the first symbol sequence based on the second data to obtain the first to-be-decoded sequence.

In an optional implementation, the demodulating the first symbol sequence based on the second data to obtain the first to-be-decoded sequence includes: determining a first amplitude and a second amplitude based on a first bit in the second data, where the first amplitude is equal to an amplitude of a symbol that is obtained by modulating the input signal through PAM-4 when the low bit and the high bit of the input signal are respectively equal to the first bit and 1, and the second amplitude is equal to an amplitude of a symbol that is obtained by modulating the input signal through PAM-4 when the low bit and the high bit of the input signal are respectively equal to the first bit and 0; determining a first absolute value and a second absolute value, where the first absolute value is equal to an absolute value of a difference between an amplitude of a first symbol and the first amplitude, the second absolute value is equal to an absolute value of a difference between the amplitude of the first symbol and the second amplitude, and the first symbol is a symbol that is in the first symbol sequence and that corresponds to the first bit; when the first absolute value is less than the second absolute value, determining that a value of a second bit in the first data is equal to 1, where the second bit is a bit corresponding to the first bit; and when the first absolute value is greater than the second absolute value, determining that a value of a second bit in the first data is equal to 0, where the second bit is the bit corresponding to the first bit.

An offset (for example, a phase may change) may occur in a transmission process of the second symbol sequence, and therefore a to-be-transmitted symbol sequence is referred to as the second symbol sequence in this application. A symbol sequence received by the decoding device is referred to as the first symbol sequence.

It should be noted that, that the second bit is a bit corresponding to the first bit means that the first bit is used as the low bit and the second bit is used as the high bit to perform PAM-4 modulation, so as to obtain a symbol in the second symbol sequence.

The first symbol is a symbol in the first symbol sequence, and the first symbol is a symbol obtained after a symbol, which is in the second symbol sequence and obtained by modulating the first bit and the second bit, is transmitted to the decoding device by using a transmission medium.

Specifically, amplitudes of symbols in the second symbol sequence sent by the encoding device to the decoding device are −3, −1, 1, and 3 sequentially, and the amplitudes −3, −1, 1, and 3 are respectively in one-to-one correspondence with values 0, 1, 2, and 3 of an input signal of a modulator. When a value of the input signal is equal to 0, both a low bit and a high bit of the input signal of the modulator are 0. When a value of the input signal is equal to 1, a low bit and a high bit of the input signal of the modulator are 1 and 0 respectively. When a value of the input signal is equal to 2, a low bit and a high bit of the input signal of the modulator are 0 and 1 respectively. When a value of the input signal is equal to 3, both a low bit and a high bit of the input signal of the modulator are 1. An error may occur in a transmission process of the second symbol sequence. For example, amplitudes of symbols in the first symbol sequence received by the decoding device are −3, −1, 1.1, and 3 sequentially. It may be learned that an error occurs in a transmission process of a symbol having an amplitude of 1, and the amplitude of the symbol received by the decoding device is 1.1.

When demodulating the symbol having an amplitude of 1.1, the decoding device first determines that 1.1 has a smallest difference from 1 among −3, −1, 1, and 3. Therefore, the decoding device determines, based on a low bit (namely, a bit 0) of an input signal corresponding to the symbol having an amplitude of 1, that a value of a low bit of an input signal corresponding to the symbol having an amplitude of 1.1 in the second to-be-decoded sequence is 0. Then, the decoding device determines, after decoding, in the second decoding manner, the second to-be-decoded sequence comprising the symbol that has an amplitude of 1.1 and that corresponds to the low bit (whose value is 0) of the input signal, that the low bit 0 may be correct or may be incorrect. If the low bit 0 is incorrect, the low bit 0 is corrected to a bit 1.

The following gives description by assuming that it is determined that the low bit after decoding is 0 is correct.

After determining that the low bit of the input signal corresponding to the symbol having an amplitude of 1.1 is 0, the decoding device determines, in the amplitudes −3, −1, 1, and 3, that the value of the input signal corresponding to the symbol having an amplitude of 1.1 may be 0 or 2, but cannot be 1 or 3. This is because when the value of the input signal is equal to 1 or 3, the low bit of the input signal is equal to 1. When the value of the input signal is equal to 0, an amplitude of a symbol corresponding to the input signal is −3 (for example, the first amplitude). When the value of the input signal is equal to 2, an amplitude of a symbol corresponding to the input signal is 1 (for example, the second amplitude). The decoding device only needs to compare the amplitude 1.1 separately with the amplitude 3 and the amplitude 1. The decoding device does not need to compare the amplitude 1.1 with the amplitude −1. The decoding device does not need to compare the amplitude 1.1 with the amplitude 3, either. Therefore, the foregoing solution helps reduce complexity of operation of the decoding device. An absolute value of a difference between 1.1 and 1 is less than an absolute value of a difference between 1.1 and −3. Therefore, the decoding device may determine that the high bit of the input signal is 0 (for example, the second bit). Reliability of determining that the low bit is 0 after decoding is relatively high, and therefore reliability of determining the high bit based on the low bit after decoding is also relatively high.

The decoding device may determine the first to-be-decoded sequence according to the foregoing method for determining the second bit, and decodes the first to-be-decoded sequence in the first decoding manner to obtain the first data that is before encoding.

By way of example but not limitation, the first decoding manner is a Bose-Chaudhuri-Hocquenghem BCH decoding manner, and the second decoding manner is a product code decoding manner or the BCH decoding manner.

By way of example but not limitation, the quantity of the bits comprised in the first to-be-decoded sequence obtained after the decoding device demodulates the first symbol sequence is 6500, and the quantity of the bits comprised in the second to-be-decoded sequence obtained after the decoding device demodulates the first symbol sequence is 6500; or the quantity of the bits comprised in the first to-be-decoded sequence obtained after the decoding device demodulates the first symbol sequence is 5376, and the quantity of the bits comprised in the second to-be-decoded sequence obtained after the decoding device demodulates the first symbol sequence is 5376; or the quantity of the bits comprised in the first to-be-decoded sequence obtained after the decoding device demodulates the first symbol sequence is 27556, and the quantity of the bits comprised in the second to-be-decoded sequence obtained after the decoding device demodulates the first symbol sequence is 27556.

By way of example but not limitation, when the quantity of the bits comprised in the first to-be-decoded sequence is 6500, and the quantity of the bits comprised in the second to-be-decoded sequence is 6500, the first data obtained after the decoding device decodes the first to-be-decoded sequence includes 6448 bits, and the second data obtained after the decoding device decodes the second to-be-decoded sequence includes 5668 bits; or when the quantity of the bits comprised in the first to-be-decoded sequence is 5376, and the quantity of the bits comprised in the second to-be-decoded sequence is 5376, the first data obtained after the decoding device decodes the first to-be-decoded sequence includes 5324 bits, and the second data obtained after the decoding device decodes the second to-be-decoded sequence includes 4700 bits; or when the quantity of the bits comprised in the first to-be-decoded sequence is 27556, and the quantity of the bits comprised in the second to-be-decoded sequence is 27556, the first data obtained after the decoding device decodes the first to-be-decoded sequence includes 27436 bits, and the second data obtained after the decoding device decodes the second to-be-decoded sequence includes 19600 bits.

The foregoing describes technical solutions provided in the embodiments of this application with reference to FIG. 1, FIG. 2, FIG. 3, and FIG. 5 to FIG. 9. The following describes an encoding apparatus and an decoding device provided in the embodiments of this application with reference to FIG. 10 to FIG. 13.

Figure 10:
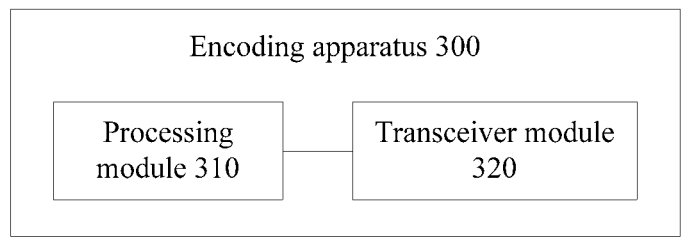
FIG. 10 is a schematic block diagram of an encoding apparatus according to an embodiment of this application.

FIG. 10 is a schematic block diagram of an encoding apparatus 300 according to an embodiment of this application. The encoding apparatus 300 includes a processing module 310 and a transceiver module 320.

For example, the encoding apparatus 300 may be configured to perform the method shown in FIG. 4. The encoding apparatus 300 may be the network device 10 in FIG. 1.

The processing module 310 is configured to encode first data in a first encoding manner to generate a first encoded sequence.

For example, the processing module 310 may include the FEC encoder 11, the FEC encoder 12, and the modulation circuit 13 in FIG. 2. Specifically, the FEC encoder 11 may encode the first data.

The processing module 310 is further configured to encode second data in a second encoding manner to generate a second encoded sequence, where a quantity of bits comprised in the first data is greater than a quantity of bits comprised in the second data, and a quantity of bits comprised in the first encoded sequence is equal to a quantity of bits comprised in the second encoded sequence.

For example, the FEC encoder 12 may encode the second data.

The processing module 310 is further configured to perform Four-level Pulse Amplitude Modulation PAM-4 modulation on an input signal to generate a symbol sequence, where the input signal includes the first encoded sequence and the second encoded sequence, the first encoded sequence corresponds to a high bit of the input signal, and the second encoded sequence corresponds to a low bit of the input signal.

For example, the modulation circuit 13 may perform PAM-4 modulation on the input signal to generate the symbol sequence.

The transceiver module 320 is configured to send the symbol sequence.

For example, the modulation circuit 13 may include the transceiver module 320.

Optionally, the first data includes 6448 bits, and the second data includes 5668 bits; or the first data includes 5324 bits, and the second data includes 4700 bits; or the first data includes 27436 bits, and the second data includes 19600 bits.

Optionally, when the first data includes 6448 bits, and the second data includes 5668 bits, the quantity of the bits comprised in the first encoded sequence is 6500, and the quantity of the bits comprised in the second encoded sequence is 6500; or when the first data includes 5324 bits, and the second data includes 4700 bits, the quantity of the bits comprised in the first encoded sequence is 5376, and the quantity of the bits comprised in the second encoded sequence is 5376; or when the first data includes 27436 bits, and the second data includes 19600 bits, the quantity of the bits comprised in the first encoded sequence is 27556, and the quantity of the bits comprised in the second encoded sequence is 27556.

Optionally, the first encoding manner is a BCH encoding manner, and the second encoding manner is a product code encoding manner or the BCH encoding manner.

Optionally, the second encoded sequence is obtained by encoding a to-be-encoded matrix in the product code encoding manner, where the to-be-encoded matrix is an (n+m)× (n+m) matrix, n≥2, m≥1, both m and n are integers, elements in columns 1 to n of each row in rows 1 to n in the to-be-encoded matrix are bits in the second data, elements in columns n+1 to n+m of row i in the to-be-encoded matrix are m bits comprised in check values that are generated based on bits in row i in the to-be-encoded matrix, elements in rows n+1 to n+m of column j in the to-be-encoded matrix are m bits comprised in check values that are generated based on bits in column j in the to-be-encoded matrix, $1 \le i \le n$, and $1 \le j \le n$.

Elements in rows n+1 to n+m of column k in the to-be-encoded matrix are m bits comprised in check values that are generated based on elements in rows 1 to n of column p in the to-be-encoded matrix, where $n+1 \le k \le n+m$, and $n+1 \le p \le n+m$; or elements in columns n+1 to n+m of row k in the to-be-encoded matrix are m bits comprised in check values that are generated based on elements in columns 1 to n of row p in the to-be-encoded matrix, where $n+1 \le k \le n+m$, and $n+1 \le p \le n+m$.

Optionally, the m bits include a first check bit and a second check bit, the first check bit is a parity bit generated based on all elements in columns 1 to n of row i in the to-be-encoded matrix or all elements in rows 1 to n of column i in the to-be-encoded matrix, and the second check bit is a parity bit generated based on elements in even-numbered columns in columns 1 to n of row i in the to-be-encoded matrix or elements in even-numbered rows in rows 1 to n of column i in the to-be-encoded matrix.

Optionally, a value of n is 140, and a value of m is 2.

It should be understood that in this embodiment of the present invention, the processing module 310 may be implemented by a processor or a processor-related circuit component, and the transceiver module 320 may be implemented by a transceiver or a transceiver-related circuit component.

Figure 11:
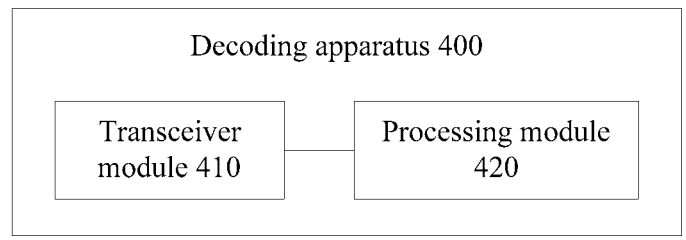
FIG. 11 is a schematic block diagram of an decoding device according to an embodiment of this application.

FIG. 11 is a schematic block diagram of a decoding apparatus 400 according to an embodiment of this application. The decoding apparatus 400 includes a transceiver module 410 and a processing module 420.

For example, the decoding apparatus 400 may be configured to perform the method shown in FIG. 9. The decoding apparatus 400 may be the network device 20 in FIG. 1.

The transceiver module 410 is configured to receive a first symbol sequence, where the first symbol sequence is generated after a second symbol sequence is transmitted to the decoding device by using a transmission medium, the second symbol sequence is obtained by performing Four-level Pulse Amplitude Modulation PAM-4 modulation on an input signal, the input signal includes a first encoded sequence and a second encoded sequence, the first encoded sequence corresponds to a high bit of the input signal, and the second encoded sequence corresponds to a low bit of the input signal.

For example, the demodulation circuit 14 may be configured to implement the transceiver module 410.

The processing module 420 is configured to demodulate the first symbol sequence to obtain a first to-be-decoded sequence.

For example, the demodulation circuit 14 may be configured to implement the processing module 420. Specifically, the demodulation circuit 14 may demodulate the first symbol sequence to obtain the first to-be-decoded sequence.

The processing module 420 is further configured to decode the first to-be-decoded sequence in a first decoding manner to obtain first data.

For example, the FEC decoder 15 may be configured to implement the processing module 420. Specifically, the FEC decoder 15 may decode the first to-be-decoded sequence.

The processing module 420 is further configured to demodulate the first symbol sequence to obtain a second to-be-decoded sequence, where a quantity of bits comprised in the first to-be-decoded sequence is equal to a quantity of bits comprised in the second to-be-decoded sequence.

For example, the demodulation circuit 14 may demodulate the first symbol sequence to obtain the second to-be-decoded sequence. An output signal of the demodulation circuit 14 includes the first to-be-decoded sequence and the second to-be-decoded sequence. The first to-be-decoded sequence corresponds to a high bit of the output signal. The second to-be-decoded sequence corresponds to a low bit of the output signal.

The processing module 420 is further configured to decode the second to-be-decoded sequence in a second decoding manner to obtain second data, where a quantity of bits comprised in the first data is greater than a quantity of bits comprised in the second data.

For example, the FEC decoder 16 may be configured to implement the processing module 420. Specifically, the FEC decoder 16 may decode the second to-be-decoded sequence.

Optionally, the processing module 420 is further configured to demodulate the first symbol sequence based on the second data to obtain the first to-be-decoded sequence.

Optionally, that the processing module 420 is further configured to demodulate the first symbol sequence based on the second data to obtain the first to-be-decoded sequence includes: determining a first amplitude and a second amplitude based on a first bit in the second data, where the first amplitude is equal to an amplitude of a symbol that is obtained by modulating an input signal through PAM-4 when the low bit and the high bit of the input signal are respectively equal to the first bit and 1, and the second amplitude is equal to an amplitude of a symbol that is obtained by modulating an input signal through PAM-4 when the low bit and the high bit of the input signal are respectively equal to the first bit and 0; determining a first absolute value and a second absolute value, where the first absolute value is equal to an absolute value of a difference between an amplitude of a first symbol and the first amplitude, the second absolute value is equal to an absolute value of a difference between the amplitude of the first symbol and the second amplitude, and the first symbol is a symbol that is in the first symbol sequence and that corresponds to the first bit; when the first absolute value is less than the second absolute value, determining that a value of a second bit in the first data is equal to 1, where the second bit is a bit corresponding to the first bit; and when the first absolute value is greater than the second absolute value, determining that a value of a second bit in the first data is equal to 0, where the second bit is the bit corresponding to the first bit.

Optionally, the first decoding manner is a Bose-Chaudhuri-Hocquenghem BCH decoding manner, and the second decoding manner is a product code decoding manner or the BCH decoding manner.

Optionally, the quantity of the bits comprised in the first to-be-decoded sequence obtained after the decoding device demodulates the first symbol sequence is 6500, and the quantity of the bits comprised in the second to-be-decoded sequence obtained after the decoding device demodulates the first symbol sequence is 6500; or the quantity of the bits comprised in the first to-be-decoded sequence obtained after the decoding device demodulates the first symbol sequence is 5376, and the quantity of the bits comprised in the second to-be-decoded sequence obtained after the decoding device demodulates the first symbol sequence is 5376; or the quantity of the bits comprised in the first to-be-decoded sequence obtained after the decoding device demodulates the first symbol sequence is 27556, and the quantity of the bits comprised in the second to-be-decoded sequence obtained after the decoding device demodulates the first symbol sequence is 27556.

Optionally, when the quantity of the bits comprised in the first to-be-decoded sequence is 6500, and the quantity of the bits comprised in the second to-be-decoded sequence is 6500, the first data obtained after the decoding device decodes the first to-be-decoded sequence includes 6448 bits, and the second data obtained after the decoding device decodes the second to-be-decoded sequence includes 5668 bits; or when the quantity of the bits comprised in the first to-be-decoded sequence is 5376, and the quantity of the bits comprised in the second to-be-decoded sequence is 5376, the first data obtained after the decoding device decodes the first to-be-decoded sequence includes 5324 bits, and the second data obtained after the decoding device decodes the second to-be-decoded sequence includes 4700 bits; or when the quantity of the bits comprised in the first to-be-decoded sequence is 27556, and the quantity of the bits comprised in the second to-be-decoded sequence is 27556, the first data obtained after the decoding device decodes the first to-be-decoded sequence includes 27436 bits, and the second data obtained after the decoding device decodes the second to-be-decoded sequence includes 19600 bits.

It should be understood that in this embodiment of the present invention, the processing module 420 may be implemented by a processor or a processor-related circuit component, and the transceiver module 410 may be implemented by a transceiver or a transceiver-related circuit component.

Figure 12:
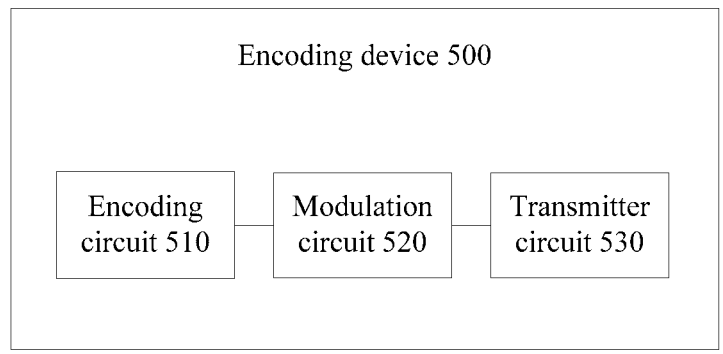
FIG. 12 is a schematic block diagram of an encoding apparatus according to an embodiment of this application.

FIG. 12 is a schematic block diagram of an encoding device 500 according to an embodiment of this application. The encoding device 500 includes an encoding circuit 510, a modulation circuit 520, and a transmitter circuit 530.

The encoding circuit 510 is configured to encode first data in a first encoding manner to generate a first encoded sequence.

The encoding circuit 510 is further configured to encode second data in a second encoding manner to generate a second encoded sequence, where a quantity of bits comprised in the first data is greater than a quantity of bits comprised in the second data, and a quantity of bits comprised in the first encoded sequence is equal to a quantity of bits comprised in the second encoded sequence.

The modulation circuit 520 is configured to perform Four-level Pulse Amplitude Modulation PAM-4 modulation on an input signal to generate a symbol sequence, where the input signal includes the first encoded sequence and the second encoded sequence, the first encoded sequence corresponds to a high bit of the input signal, and the second encoded sequence corresponds to a low bit of the input signal.

The transmitter circuit 530 is configured to send the symbol sequence.

Optionally, the first data includes 6448 bits, and the second data includes 5668 bits; or the first data includes 5324 bits, and the second data includes 4700 bits; or the first data includes 27436 bits, and the second data includes 19600 bits.

Optionally, when the first data includes 6448 bits, and the second data includes 5668 bits, the quantity of the bits comprised in the first encoded sequence is 6500, and the quantity of the bits comprised in the second encoded sequence is 6500; or when the first data includes 5324 bits, and the second data includes 4700 bits, the quantity of the bits comprised in the first encoded sequence is 5376, and the quantity of the bits comprised in the second encoded sequence is 5376; or when the first data includes 27436 bits, and the second data includes 19600 bits, the quantity of the bits comprised in the first encoded sequence is 27556, and the quantity of the bits comprised in the second encoded sequence is 27556.

Optionally, the first encoding manner is a BCH encoding manner, and the second encoding manner is a product code encoding manner or the BCH encoding manner.

Optionally, the second encoded sequence is obtained by encoding a to-be-encoded matrix in the product code encoding manner, where the to-be-encoded matrix is an (n+m)×(n+m) matrix, n≥2, m≥1, both m and n are integers, elements in columns 1 to n of each row in rows 1 to n in the to-be-encoded matrix are bits in the second data, elements in columns n+1 to n+m of row i in the to-be-encoded matrix are m bits comprised in check values that are generated based on bits in row i in the to-be-encoded matrix, elements in rows n+1 to n+m of column j in the to-be-encoded matrix are m bits comprised in check values that are generated based on bits in column j in the to-be-encoded matrix, 1≤i≤n, and 1≤j≤n.

Elements in rows n+1 to n+m of column k in the to-be-encoded matrix are m bits comprised in check values that are generated based on elements in rows 1 to n of column p in the to-be-encoded matrix, where n+1≤k≤n+m, and n+1≤p≤n+m; or elements in columns n+1 to n+m of row k in the to-be-encoded matrix are m bits comprised in check values that are generated based on elements in columns 1 to n of row p in the to-be-encoded matrix, where n+1≤k≤n+m, and n+1≤p≤n+m.

Optionally, the m bits include a first check bit and a second check bit, the first check bit is a parity bit generated based on all elements in columns 1 to n of row i in the to-be-encoded matrix or all elements in rows 1 to n of column i in the to-be-encoded matrix, and the second check bit is a parity bit generated based on elements in even-numbered columns in columns 1 to n of row i in the to-be-encoded matrix or elements in even-numbered rows in rows 1 to n of column i in the to-be-encoded matrix.

Optionally, a value of n is 140, and a value of m is 2.

Figure 13:
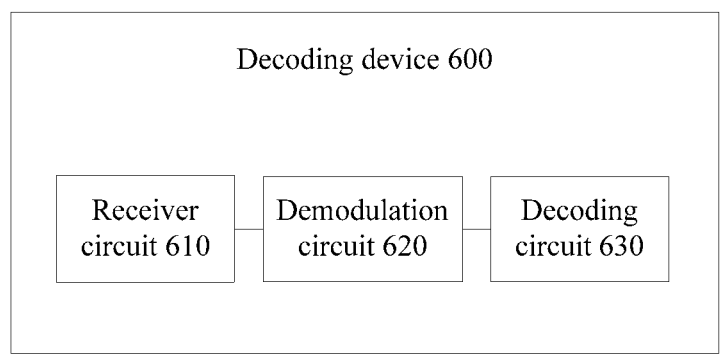
FIG. 13 is a schematic block diagram of an decoding device according to an embodiment of this application.

FIG. 13 is a schematic block diagram of a decoding device 600 according to an embodiment of this application. The decoding device 600 includes a receiver circuit 610, a demodulation circuit 620, and a decoding circuit 630.

The receiver circuit 610 is configured to receive a first symbol sequence, where the first symbol sequence is generated after a second symbol sequence is transmitted to the decoding device by using a transmission medium, the second symbol sequence is obtained by performing Four-level Pulse Amplitude Modulation PAM-4 modulation on an input signal, the input signal includes a first encoded sequence and a second encoded sequence, the first encoded sequence corresponds to a high bit of the input signal, and the second encoded sequence corresponds to a low bit of the input signal.

The demodulation circuit 620 is configured to demodulate the first symbol sequence to obtain a first to-be-decoded sequence.

The decoding circuit 630 is further configured to decode the first to-be-decoded sequence in a first decoding manner to obtain first data.

The demodulation circuit 620 is further configured to demodulate the first symbol sequence to obtain a second to-be-decoded sequence, where a quantity of bits comprised in the first to-be-decoded sequence is equal to a quantity of bits comprised in the second to-be-decoded sequence.

The decoding circuit 630 is further configured to decode the second to-be-decoded sequence in a second decoding manner to obtain second data, where a quantity of bits comprised in the first data is greater than a quantity of bits comprised in the second data.

Optionally, the demodulation circuit 620 is further configured to demodulate the first symbol sequence based on the second data to obtain the first to-be-decoded sequence.

Optionally, the demodulation circuit 620 is further configured to determine a first amplitude and a second amplitude based on a first bit in the second data, where the first amplitude is equal to an amplitude of a symbol that is obtained by modulating an input signal through PAM-4 when the low bit and the high bit of the input signal are respectively equal to the first bit and 1, and the second amplitude is equal to an amplitude of a symbol that is obtained by modulating an input signal through PAM-4 when the low bit and the high bit of the input signal are respectively equal to the first bit and 0; determine a first absolute value and a second absolute value, where the first absolute value is equal to an absolute value of a difference between an amplitude of a first symbol and the first amplitude, the second absolute value is equal to an absolute value of a difference between the amplitude of the first symbol and the second amplitude, and the first symbol is a symbol that is in the first symbol sequence and that corresponds to the first bit; when the first absolute value is less than the second absolute value, determine that a value of a second bit in the first data is equal to 1, where the second bit is a bit corresponding to the first bit; and when the first absolute value is greater than the second absolute value, determine that a value of a second bit in the first data is equal to 0, where the second bit is the bit corresponding to the first bit.

Optionally, the first decoding manner is a Bose-Chaudhuri-Hocquenghem BCH decoding manner, and the second decoding manner is a product code decoding manner or the BCH decoding manner.

Optionally, the quantity of the bits comprised in the first to-be-decoded sequence obtained after the decoding device demodulates the first symbol sequence is 6500, and the quantity of the bits comprised in the second to-be-decoded sequence obtained after the decoding device demodulates the first symbol sequence is 6500; or the quantity of the bits comprised in the first to-be-decoded sequence obtained after the decoding device demodulates the first symbol sequence is 5376, and the quantity of the bits comprised in the second to-be-decoded sequence obtained after the decoding device demodulates the first symbol sequence is 5376; or the quantity of the bits comprised in the first to-be-decoded sequence obtained after the decoding device demodulates the first symbol sequence is 27556, and the quantity of the bits comprised in the second to-be-decoded sequence obtained after the decoding device demodulates the first symbol sequence is 27556.

Optionally, when the quantity of the bits comprised in the first to-be-decoded sequence is 6500, and the quantity of the bits comprised in the second to-be-decoded sequence is 6500, the first data obtained after the decoding device decodes the first to-be-decoded sequence includes 6448 bits, and the second data obtained after the decoding device decodes the second to-be-decoded sequence includes 5668 bits; or when the quantity of the bits comprised in the first to-be-decoded sequence is 5376, and the quantity of the bits comprised in the second to-be-decoded sequence is 5376, the first data obtained after the decoding device decodes the first to-be-decoded sequence includes 5324 bits, and the second data obtained after the decoding device decodes the second to-be-decoded sequence includes 4700 bits; or when the quantity of the bits comprised in the first to-be-decoded sequence is 27556, and the quantity of the bits comprised in the second to-be-decoded sequence is 27556, the first data obtained after the decoding device decodes the first to-be-decoded sequence includes 27436 bits, and the second data obtained after the decoding device decodes the second to-be-decoded sequence includes 19600 bits.

It should be understood that the processor mentioned in the embodiments of the present invention may be a central processing unit (CPU), or may be another general purpose processor, a digital signal processor (DSP), an application-specific integrated circuit (ASIC), a field programmable gate array (FPGA) or another programmable logical device, a discrete gate or a transistor logical device, a discrete hardware assembly, or the like. The general purpose processor may be a microprocessor, or the processor may be any conventional processor or the like.

It should also be further understood that the memory mentioned in the embodiments of the present invention may be a volatile memory or a non-volatile memory, or may include both a volatile memory and a non-volatile memory. The non-volatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), which is used as an external cache. By way of example but not limitative description, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchronous link dynamic random access memory (SLDRAM), and a direct rambus random access memory (DR RAM).

It should be noted that, when the processor is a general purpose processor, a DSP, an ASIC, an FPGA or another programmable logical device, a discrete gate or transistor logic device, or a discrete hardware component, the memory (a storage module) is integrated into the processor.

It should be noted that the memory described in this specification includes but is not limited to these and any memory of another proper type.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a specific working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer readable storage medium. Based on such an understanding, the technical solutions of this application essentially, or the part contributing to the prior art, or some of the technical solutions may be implemented in a form of a software product. The software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An encoding method, wherein the method is performed by an encoding device, and comprises:
    encoding first data in a first encoding manner to generate a first encoded sequence;
    encoding second data in a second encoding manner to generate a second encoded sequence, wherein a quantity of bits comprised in the first data is greater than a quantity of bits comprised in the second data, and a quantity of bits comprised in the first encoded sequence is equal to a quantity of bits comprised in the second encoded sequence;
    performing Four-level Pulse Amplitude Modulation (PAM-4) modulation on an input signal to generate a symbol sequence, wherein the input signal comprises the first encoded sequence and the second encoded sequence, the first encoded sequence corresponds to a high bit of the input signal, and the second encoded sequence corresponds to a low bit of the input signal; and
    sending the symbol sequence;
    wherein the first data comprises 6448 bits, and the second data comprises 5668 bits; or
    the first data comprises 5324 bits, and the second data comprises 4700 bits; or
    the first data comprises 27436 bits, and the second data comprises 19600 bits.

2. The method according to claim 1, wherein when the first data comprises 6448 bits, and the second data comprises 5668 bits, the quantity of the bits comprised in the first encoded sequence is 6500, and the quantity of the bits comprised in the second encoded sequence is 6500; or
    when the first data comprises 5324 bits, and the second data comprises 4700 bits, the quantity of the bits comprised in the first encoded sequence is 5376, and the quantity of the bits comprised in the second encoded sequence is 5376; or
    when the first data comprises 27436 bits, and the second data comprises 19600 bits, the quantity of the bits comprised in the first encoded sequence is 27556, and the quantity of the bits comprised in the second encoded sequence is 27556.

3. The method according to claim 1, wherein the first encoding manner is a Bose-Chaudhuri-Hocquenghem (BCH) encoding manner, and the second encoding manner is a product code encoding manner.

4. The method according to claim 3, wherein
    the second encoded sequence is obtained by encoding a to-be-encoded matrix in the product code encoding manner, wherein the to-be-encoded matrix is an $(n+m) \times (n+m)$ matrix, $n \geq 2$, $m \geq 1$, both m and n are integers, $n^2$ elements in rows 1 to n and columns 1 to n in the to-be-encoded matrix are respectively $n^2$ bits in the second data, m elements in columns n+1 to n+m of row i in the to-be-encoded matrix are m bits comprised in check values that are generated based on n elements in columns 1 to n of row i in the to-be-encoded matrix, and elements in rows n+1 to n+m of column j in the to-be-encoded matrix are m bits comprised in check values that are generated based on n elements in rows 1 to n of column j in the to-be-encoded matrix, wherein $1 \leq i \leq n$, and $1 \leq j \leq n$; and
    m elements in rows n+1 to n+m of column k in the to-be-encoded matrix are m bits comprised in check values that are generated based on n elements in rows 1 to n of column p in the to-be-encoded matrix, wherein $n+1 \leq k \leq n+m$, and $n+1 \leq p \leq n+m$; or m elements in columns n+1 to n+m of row k in the to-be-encoded matrix are m bits comprised in check values that are generated based on n elements in columns 1 to n of row p in the to-be-encoded matrix, wherein $n+1 \leq k \leq n+m$, and $n+1 \leq p \leq n+m$.

5. The method according to claim 4, wherein the m bits comprise a first check bit and a second check bit, the first check bit is a parity bit generated based on the n elements in columns 1 to n of row i in the to-be-encoded matrix or n elements in rows 1 to n of column i in the to-be-encoded matrix, and the second check bit is a parity bit generated based on elements in even-numbered columns in columns 1 to n of row i in the to-be-encoded matrix or elements in even-numbered rows in rows 1 to n of column i in the to-be-encoded matrix.

6. The encoding device according to claim 4, wherein a value of n is 140, and a value of m is 2.

7. An encoding device, comprising:
at least one processor; and
a computer-readable storage medium comprising instructions that, when executed by the at least one processor, configure the encoding device to:
encode first data in a first encoding manner to generate a first encoded sequence;
encode second data in a second encoding manner to generate a second encoded sequence, wherein a quantity of bits comprised in the first data is greater than a quantity of bits comprised in the second data, and a quantity of bits comprised in the first encoded sequence is equal to a quantity of bits comprised in the second encoded sequence;
perform Four-level Pulse Amplitude Modulation (PAM-4) modulation on an input signal to generate a symbol sequence, wherein the input signal comprises the first encoded sequence and the second encoded sequence, the first encoded sequence corresponds to a high bit of the input signal, and the second encoded sequence corresponds to a low bit of the input signal; and
the symbol sequence;
wherein the first data comprises 6448 bits, and the second data comprises 5668 bits; or
the first data comprises 5324 bits, and the second data comprises 4700 bits; or
the first data comprises 27436 bits, and the second data comprises 19600 bits.

8. The encoding device according to claim 7, wherein when the first data comprises 6448 bits, and the second data comprises 5668 bits, the quantity of the bits comprised in the first encoded sequence is 6500, and the quantity of the bits comprised in the second encoded sequence is 6500; or
when the first data comprises 5324 bits, and the second data comprises 4700 bits, the quantity of the bits comprised in the first encoded sequence is 5376, and the quantity of the bits comprised in the second encoded sequence is 5376; or
when the first data comprises 27436 bits, and the second data comprises 19600 bits, the quantity of the bits comprised in the first encoded sequence is 27556, and the quantity of the bits comprised in the second encoded sequence is 27556.

9. The encoding device according to claim 7, wherein first encoding manner is a Bose-Chaudhuri-Hocquenghem (BCH) encoding manner, and the second encoding manner is a product code encoding manner.

10. The encoding device according to claim 9, wherein the second encoded sequence is obtained by encoding a to-be-encoded matrix in the product code encoding manner, wherein the to-be-encoded matrix is an $(n+m) \times (n+m)$ matrix, $n \geq 2$, $m \geq 1$, both m and n are integers, elements in columns 1 to n of each row in rows 1 to n in the to-be-encoded matrix are bits in the second data, elements in columns n+1 to n+m of row i in the to-be-encoded matrix are m bits comprised in check values that are generated based on bits in row i in the to-be-encoded matrix, elements in rows n+1 to n+m of column j in the to-be-encoded matrix are m bits comprised in check values that are generated based on bits in column j in the to-be-encoded matrix, $1 \leq i \leq n$, and $1 \leq j \leq n$; and
elements in rows n+1 to n+m of column k in the to-be-encoded matrix are m bits comprised in check values that are generated based on elements in rows 1 to n of column p in the to-be-encoded matrix, wherein $n+1 \leq k \leq n+m$, and $n+1 \leq p \leq n+m$; or elements in columns n+1 to n+m of row k in the to-be-encoded matrix are m bits comprised in check values that are generated based on elements in columns 1 to n of row p in the to-be-encoded matrix, wherein $n+1 \leq k \leq n+m$, and $n+1 \leq p \leq n+m$.

11. The encoding device according to claim 10, wherein the m bits comprise a first check bit and a second check bit, the first check bit is a parity bit generated based on all elements in columns 1 to n of row i in the to-be-encoded matrix or all elements in rows 1 to n of column i in the to-be-encoded matrix, and the second check bit is a parity bit generated based on elements in even-numbered columns in columns 1 to n of row i in the to-be-encoded matrix or elements in even-numbered rows in rows 1 to n of column i in the to-be-encoded matrix.

12. The encoding device according to claim 10, wherein a value of n is 140, and a value of m is 2.

13. A decoding device, comprising:
at least one processor; and
a computer-readable storage medium comprising instructions that, when executed by the at least one processor, configure the decoding device to:
receive a first symbol sequence, wherein the first symbol sequence is generated after a second symbol sequence is transmitted to the decoding device by using a transmission medium, the second symbol sequence is obtained by performing Four-level Pulse Amplitude Modulation (PAM-4) modulation on an input signal, the input signal comprises a first encoded sequence and a second encoded sequence, the first encoded sequence corresponds to a high bit of the input signal, and the second encoded sequence corresponds to a low bit of the input signal;
demodulate the first symbol sequence to obtain a first to-be-decoded sequence;
decode the first to-be-decoded sequence in a first decoding manner to obtain first data;
demodulate the first symbol sequence to obtain a second to-be-decoded sequence, wherein a quantity of bits comprised in the first to-be-decoded sequence is equal to a quantity of bits comprised in the second to-be-decoded sequence; and
decode the second to-be-decoded sequence in a second decoding manner to obtain second data, wherein a quantity of bits comprised in the first data is greater than a quantity of bits comprised in the second data;
wherein the quantity of the bits comprised in the first to-be-decoded sequence is 6500, and the quantity of the bits comprised in the second to-be-decoded sequence is 6500; or
the quantity of the bits comprised in the first to-be-decoded sequence is 5376, and the quantity of the bits comprised in the second to-be-decoded sequence is 5376; or
the quantity of the bits comprised in the first to-be-decoded sequence is 27556, and the quantity of the bits comprised in the second to-be-decoded sequence is 27556.

14. The decoding device according to claim 13, wherein execution of the instructions further configures the decoding device to:
demodulate the first symbol sequence based on the second data to obtain the first to-be-decoded sequence.

15. The decoding device according to claim 14, wherein execution of the instructions further configures the decoding device to:
- determine a first amplitude and a second amplitude based on a first bit in the second data, wherein the first amplitude is equal to an amplitude of a symbol that is obtained by modulating the input signal through PAM-4 when the low bit and the high bit of the input signal are respectively equal to the first bit and 1, and the second amplitude is equal to an amplitude of a symbol that is obtained by modulating the input signal through PAM-4 when the low bit and the high bit of the input signal are respectively equal to the first bit and 0;
- determine a first absolute value and a second absolute value, wherein the first absolute value is equal to an absolute value of a difference between an amplitude of a first symbol and the first amplitude, the second absolute value is equal to an absolute value of a difference between the amplitude of the first symbol and the second amplitude, and the first symbol is a symbol that is in the first symbol sequence and that corresponds to the first bit;
- when the first absolute value is less than the second absolute value, determine that a value of a second bit in the first data is equal to 1, wherein the second bit is a bit corresponding to the first bit; and
- when the first absolute value is greater than the second absolute value, determine that a value of a second bit in the first data is equal to 0, wherein the second bit is the bit corresponding to the first bit.

16. The decoding device according to claim 13, wherein the quantity of the bits comprised in the first to-be-decoded sequence is 6500, and the quantity of the bits comprised in the second to-be-decoded sequence is 6500; or
- the quantity of the bits comprised in the first to-be-decoded sequence is 5376, and the quantity of the bits comprised in the second to-be-decoded sequence is 5376; or
- the quantity of the bits comprised in the first to-be-decoded sequence is 27556, and the quantity of the bits comprised in the second to-be-decoded sequence is 27556.

17. The decoding device according to claim 16, wherein when the quantity of the bits comprised in the first to-be-decoded sequence is 6500, and the quantity of the bits comprised in the second to-be-decoded sequence is 6500, the first data comprises 6448 bits, and the second data comprises 5668 bits; or
- when the quantity of the bits comprised in the first to-be-decoded sequence is 5376, and the quantity of the bits comprised in the second to-be-decoded sequence is 5376, the first data comprises 5324 bits, and the second data comprises 4700 bits; or
- when the quantity of the bits comprised in the first to-be-decoded sequence is 27556, and the quantity of the bits comprised in the second to-be-decoded sequence is 27556, the first data comprises 27436 bits, and the second data comprises 19600 bits.

18. The decoding device according to any one of claim 13, wherein the first decoding manner is a Bose-Chaudhuri-Hocquenghem (BCH) decoding manner, and the second decoding manner is a product code decoding manner.

* * * * *